(12) United States Patent
Bhattacharyya

(10) Patent No.: US 6,900,667 B2
(45) Date of Patent: May 31, 2005

(54) LOGIC CONSTRUCTIONS AND ELECTRONIC DEVICES

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/387,090

(22) Filed: Mar. 11, 2003

(65) Prior Publication Data

US 2004/0178826 A1 Sep. 16, 2004

(51) Int. Cl.[7] .......................... H01L 25/00; H01L 27/01; H01L 27/12; H01L 31/0392
(52) U.S. Cl. ...................................... 326/103; 257/347
(58) Field of Search .......................... 326/103; 257/314, 257/315, 347, 621, 55, 66, 192; 438/305, 162, 459; 365/149

(56) References Cited

U.S. PATENT DOCUMENTS

| | | | | | |
|---|---|---|---|---|---|
| 5,218,213 | A | * | 6/1993 | Gaul et al. | 257/55 |
| 5,240,876 | A | * | 8/1993 | Gaul et al. | 438/459 |
| 5,583,368 | A | * | 12/1996 | Kenney | 257/621 |
| 5,665,981 | A | * | 9/1997 | Banerjee et al. | 257/66 |
| 5,834,354 | A | * | 11/1998 | Kadosh et al. | 438/305 |
| 5,920,088 | A | * | 7/1999 | Augusto | 257/192 |
| 5,985,703 | A | * | 11/1999 | Banerjee | 438/162 |
| 6,509,586 | B2 | * | 1/2003 | Awano | 257/192 |
| 6,713,810 | B1 | * | 3/2004 | Bhattacharyya | 257/315 |
| 6,759,712 | B2 | * | 7/2004 | Bhattacharyya | 257/347 |
| 6,768,156 | B1 | * | 7/2004 | Bhattacharyya | 257/314 |
| 6,845,034 | B2 | * | 1/2005 | Bhattacharyya | 365/149 |

OTHER PUBLICATIONS

Feder, B.J., "I.B.M. Finds Way to Speed Up Chips", The New York Times, Jun. 8, 2001, reprinted from http://www.nytimes.com/2001/06/08/technology/08BLUE.html, 2 pgs.

Rim, K. et al., "Strained Si NMOSFET's for High Performance CMOS Technology", 2001 Sympos. on VLSI Tech. Digest of Technical Papers, p. 59–60.

Li, P. et al., "Design of High Speed Si/SiGe Heterojunction Complementary MOSFETs with Reduced Short–Channel Effects", Natl. Central University, ChungLi, Taiwan., ROC, Aug. 2001, Contract No. NSC 89–2215–E–008–049, National Science Council of Taiwan, pp. 1, 9.

Ernst, T. et al., "Fabrication of a Novel Strained SiGe:C–channel Planar 55 nm nMOSFET for High–Performance CMOS", 2002 Sympos. on VLSI Tech. Digest of Technical Papers, pp. 92–93.

(Continued)

*Primary Examiner*—Patrick Wambley
(74) *Attorney, Agent, or Firm*—Wells St. John P.S.

(57) ABSTRACT

The invention includes a TFT-based logic circuit construction. Such construction includes a pair of first transistor devices, and a pair of second transistor devices over the first transistor devices. The first transistor devices have first active regions extending into a first semiconductive material, and the second transistor devices have second active regions extending into a second semiconductive material. At least one of the first and second semiconductive materials can comprise crystalline Si/Ge. The logic construction can comprise NOR circuitry and/or NAND circuitry, as well as higher level logic cells, such as latches. Further, the logic circuit construction can be associated with a semiconductor-on-insulator structure, and on versatile substrates. The invention includes three-dimensional logic cell layout configurations for enhanced wireability and logic cell density, which can lead to enhanced performance.

70 Claims, 11 Drawing Sheets

OTHER PUBLICATIONS

Rim, K. et al., "Characteristics and Device Design of Sub–100 nm Strained SiN– and PMOSFETs", 2002 Sympos. on VLSI Tech. Digest of Technical Papers, pp. 98–99.

Belford, R.E. et al., "Performance–Augmented CMOS Using Back–End Uniaxial Strain", DRC Conf. Digest, 2002, pp. 41–42.

Shima, M. et al., "<100> Channel Strained–SiGe p–MOSFET with Enhanced Hole Mobility and Lower Parasitic Resistance", 2002 Sympos. on VLSI Tech. Digest of Technical Papers, pp. 94–95.

Nayfeh, H.M. et al., "Electron Inversion Layer Mobility in Strained–Si n–MOSFET's with High Channel Doping Concentration Achieved by Ion Implantation", DRC Conf. Digest, 2002, pp. 43–44.

Bae, G.J. et al., "A Novel SiGe–Inserted SOI Structure for High Performance PDSOI CMOSFET", IEDM Tech. Digest, 2000, pp. 667–670.

Cheng, Z. et al., "SiGe–on–Insulator (SGOI): Substrate Preparation and MOSFET Fabrication for Electron Mobility Evaluation" and conference outline, MIT Microsystems, Tech. Labs, Cambridge, MA, 2001 IEEE Internatl. SOI Conf., Oct. 2001, pp. 13–14, 3–pg. outline.

Huang, L.J. et al., "Carrier Mobility Enhancement in Strained Si–on–Insulator Fabricated by Wafer Bonding", 2001 Sympos. on VLSI Tech. Digest of Technical Papers, pp. 57–58.

Ono, K. et al., "Analysis of Current–Voltage Characteristics in Polysilicon TFTs for LCDs", IEDM Tech. Digest, 1988, pp. 256–259.

Yamauchi, N. et al., "Drastically Improved Performance in Poly–Si TFTs with Channel Dimensions Comparable to Grain Size", IEDM Tech. Digest, 1989, pp. 353–356.

King, T. et al, "A Low–Temperature ($\leq$550° C.) Silicon–Germanium MOS Thin–Film Transistor Technology for Large–Area Electronics", IEDM Tech. Digest, 1991, pp. 567–570.

Kuriyama, H. et al., "High Mobility Poly–Si TFT by a New Excimer Laser Annealing Method for Large Area Electronics", IEDM Tech. Digest, 1991, pp. 563–566.

Jeon, J. et al., "A New Poly–Si TFT with Selectively Doped Channel Fabricated by Novel Excimer Laser Annealing", IEDM Tech. Digest, 2000, pp. 213–216.

Kim, C.H. et al., "A New High –Performance Poly–Si TFT by Simple Excimer Laser Annealing on Selectively Floating a–Si Layer", IEDM Tech. Digest, 2001, pp. 751–754.

Hara, A. et al., "Selective Single–Crystalline–Silicon Growth at the Pre–Defined Active Regions of TFTs on a Glass by a Scanning CW Layer Irradiation", IEDM Tech. Digest, 2000, pp. 209–212.

Hara, A. et al., "High Performance Poly–Si TFTs on a Glass by a Stable Scanning CW Laser Lateral Crystallization", IEDM Tech. Digest, 2001, pp. 747–750.

Jagar, S. et al., "Single Grain Thin–Film–Transistor (TFT) with SOI CMOS Performance Formed by Metal–Induced–Lateral–Crystallization", IEDM Tech. Digest, 1999, p. 293–296.

Gu, J. et al., "High Performance Sub–100 nm Si Thin–Film Transistors by Pattern–Controlled Crystallization of Thin Channel Layer and High Temperature Annealing", DRC Conference Digest, 2002, pp. 49–50.

Kesan, V. et al., "High Performance 0.25 $\mu$m p–MOSFETs with Silicon– Germanium Channels for 300K and 77K Operation", IEDM Tech. Digest, 1991, pp. 25–28.

Garone, P.M. et al., "Mobility Enhancement and Quantum Mechanical Modeling in $Ge_xSi_{1-x}$ Channel MOSFETs from 90 to 300K", IEDM Tech. Digest, 1991, pp. 29–32.

Mizuno, T. et al., "High Performance CMOS Operation of Strained–SOI MOSFETs Using Thin Film SiGe–on–Insulator Substrate", 2002 Sympos. on VLSI Tech. Digest of Technical Papers, p. 106–107.

Tezuka, T. et al., "High–Performance Strained Si–on–Insulator MOSFETs by Novel Fabrication Processes Utilizing Ge–Condensation Technique", 2002 VLSI Tech. Digest of Technical Papers, pp. 96–97.

Takagi, S., "Strained–Si– and SiGe–on–Insulator (Strained SOI and SGOI) MOSFETs for High Performance/Low Power CMOS Application", DRC Conf. Digest, 2002, pp. 37–40.

"IBM Builds World's Fastest Communications Microchip", Reuters U.S. Company News, Feb. 25, 2002, reprinted from http://activequote300.fidelity.com/rtrnews/ individual_n.../..., 1 pg.

Markoff, J., "I.B.M. Circuits are Now Faster and Reduce Use of Power", The New York Times, Feb. 25, 2002, reprinted Mar. 20, 2002 from http://story.news.yahoo.com/news?tmpl=story&u=/nyt/20020225/..., 1 pg.

Park, J.S. et al., "Normal Incident SiGe/Si Multiple Quantum Well Infrared Detector", IEDM Tech. Digest, 1991, pp. 749–752.

Current, M.I. et al., "Atomic–Layer Cleaving with $Si_xGe_y$ Strain Layers for Fabrication of Si and Ge–Rich SOI Device Layers", 2001 IEEE Internatl. SOI Conf. Oct. 2001, pp. 11–12.

Bhattacharyya, A., "The Role of Microelectronic Integration in Environmental Control: A Perspective", Mat. Res. Soc. Symp. Proc. vol. 344, 1994, pp. 281–293.

Myers, S.M. et al., "Deuterium Interactions in Oxygen–Implanted Copper", J. Appl. Phys., vol. 65(1), Jan. 1, 1989, p. 311–321.

Saggio, M. et al., "Innovative Localized Lifetime Control in High–Speed IGBT's", IEEE Elec. Dev. Lett., V. 18, No. 7, Jul. 1997, pp. 333–335.

Lu, N.C.C. et al., "A Buried–Trench DRAM Cell Using a Self–Aligned Epitaxy Over Trench Technology", IEDM Tech. Digest, 1988, pp. 588–591.

Yamada, T. et al., "Spread Source/Drain (SSD) MOSFET Using Selective Silicon Growth for 64Mbit DRAMs", IEDM Tech. Digest, 1989, pp. 35–38.

van Meer, H. et al., "Ultra–Thin Film Fully–Depleted SOI CMOS with Raised G/S/D Device Architecture for Sub–100 nm Applications", 2001 IEEE Internatl. SOI Conf. Oct. 2001, pp. 45–46.

* cited by examiner

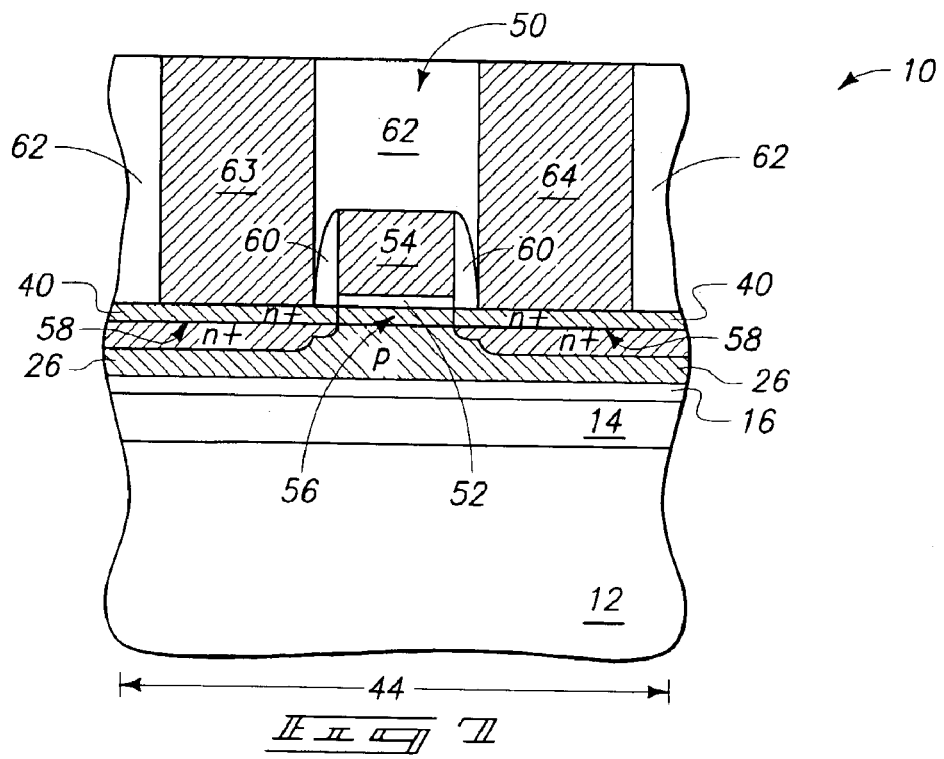
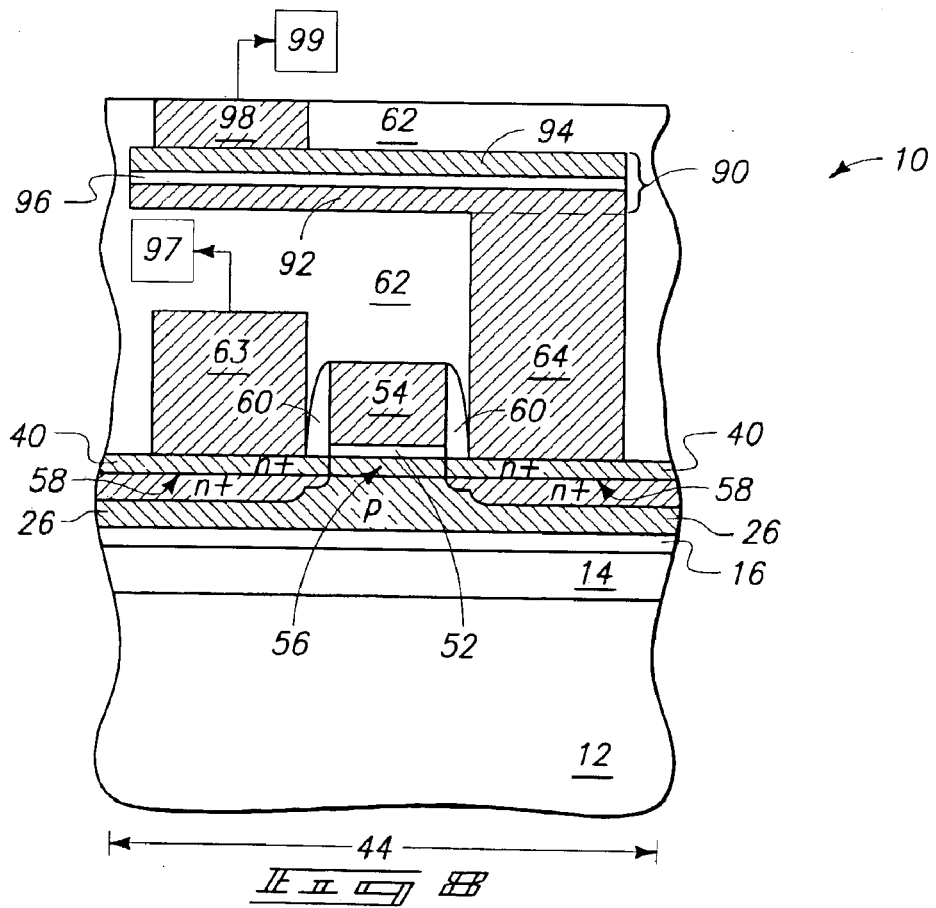

⊠ TOP LEVEL CONTACT
⊠ BOTTOM LEVEL CONTACT

LOGIC CONSTRUCTIONS AND ELECTRONIC DEVICES

TECHNICAL FIELD

This disclosure relates generally to integrated circuits. In particular aspects, the invention pertains to logic devices. The logic devices can be utilized in electronic systems; and can be incorporated into, for example, processor devices for computer systems.

BACKGROUND OF THE INVENTION

SOI technology differs from traditional bulk semiconductor technologies in that the active semiconductor material of SOI technologies is typically much thinner than that utilized in bulk technologies. The active semiconductor material of SOI technologies will typically be formed as a thin film over an insulating material (typically oxide), with exemplary thicknesses of the semiconductor film being less than or equal to 2000 Å. In contrast, bulk semiconductor material will typically have a thickness of at least about 200 microns. The thin semiconductor of SOI technology can allow higher performance and lower power consumption to be achieved in integrated circuits than can be achieved with similar circuits utilizing bulk materials.

An exemplary integrated circuit device that can be formed utilizing SOI technologies is a so-called thin film transistor (TFT), with the term "thin film" referring to the thin semiconductor film of the SOI construction. In particular aspects, the semiconductor material of the SOI construction can be silicon, and in such aspects the TFTs can be fabricated using recrystallized amorphous silicon or polycrystalline silicon. The silicon can be supported by an electrically insulative material (such as silicon dioxide), which in turn is supported by an appropriate substrate. Exemplary substrate materials include glass, bulk silicon and metal-oxides (such as, for example, $Al_2O_3$). If the semiconductor material comprises silicon, the term SOI is occasionally utilized to refer to a silicon-on-insulator construction, rather than the more general concept of a semiconductor-on-insulator construction. However, it is to be understood that in the context of this disclosure the term SOI refers to semiconductor-on-insulator constructions. Accordingly, the semiconductor material of an SOI construction referred to in the context of this disclosure can comprise other semiconductive materials in addition to, or alternatively to, silicon; including, for example, germanium.

A problem associated with conventional TFT constructions is that grain boundaries and defects can limit carrier mobilities. Accordingly, carrier mobilities are frequently nearly an order of magnitude lower than they would be in bulk semiconductor devices. High voltage (and therefore high power consumption), and large areas are utilized for the TFTs, and the TFTs exhibit limited performance. TFTs thus have limited commercial application and currently are utilized primarily for large area electronics.

Various efforts have been made to improve carrier mobility of TFTs. Some improvement is obtained for devices in which silicon is the semiconductor material by utilizing a thermal anneal for grain growth following silicon ion implantation and hydrogen passivation of grain boundaries (see, for example, Yamauchi, N. et al., "Drastically Improved Performance in Poly-Si TFTs with Channel Dimensions Comparable to Grain Size", IEDM Tech. Digest, 1989, pp. 353–356). Improvements have also been made in devices in which a combination of silicon and germanium is the semiconductor material by optimizing the germanium and hydrogen content of silicon/germanium films (see, for example, King, T. J. et al, "A Low-Temperature (<=550° C.) Silicon-Germanium MOS TFT Technology for Large-Area Electronics", IEDM Tech. Digest, 1991, pp. 567–570).

Investigations have shown that nucleation, direction of solidification, and grain growth of silicon crystals can be controlled selectively and preferentially by excimer laser annealing, as well as by lateral scanning continuous wave laser irradiation/anneal for recrystallization (see, for example, Kuriyama, H. et al., "High Mobility Poly-Si TFT by a New Excimer Laser Annealing Method for Large Area Electronics", IEDM Tech. Digest, 1991, pp. 563–566; Jeon, J. H. et al., "A New Poly-Si TFT with Selectively Doped Channel Fabricated by Novel Excimer Laser Annealing", IEDM Tech. Digest, 2000, pp. 213–216; Kim, C. H. et al., "A New High -Performance Poly-Si TFT by Simple Excimer Laser Annealing on Selectively Floating a Si Layer", IEDM Tech. Digest, 2001, pp. 753–756; Hara, A. et al, "Selective Single-Crystalline-Silicon Growth at the Pre-Defined Active Regions of TFTs on a Glass by a Scanning CW Layer Irradiation", IEDM Tech. Digest, 2000, pp. 209–212; and Hara, A. et al., "High Performance Poly-Si TFTs on a Glass by a Stable Scanning CW Laser Lateral Crystallization", IEDM Tech. Digest, 2001, pp. 747–750). Such techniques have allowed relatively defect-free large crystals to be grown, with resulting TFTs shown to exhibit carrier mobility over 300 $cm^2$/V-second.

Another technique which has shown promise for improving carrier mobility is metal-induced lateral recrystallization (MILC), which can be utilized in conjunction with an appropriate high temperature anneal (see, for example, Jagar, S. et al., "Single Grain TFT with SOI CMOS Performance Formed by Metal-Induced-Lateral-Crystallization", IEDM Tech. Digest, 1999, p. 293–296; and Gu, J. et al., "High Performance Sub-100 nm Si TFT by Pattern-Controlled Crystallization of Thin Channel Layer and High Temperature Annealing", DRC Conference Digest, 2002, pp. 49–50). A suitable post-recrystallization anneal for improving the film quality within silicon recrystallized by MILC is accomplished by exposing recrystallized material to a temperature of from about 850° C. to about 900° C. under an inert ambient (with a suitable ambient comprising, for example, $N_2$). MILC can allow nearly single crystal silicon grains to be formed in predefined amorphous-silicon islands for device channel regions. Nickel-induced-lateral-recrystallization can allow device properties to approach those of single crystal silicon.

The carrier mobility of a transistor channel region can be significantly enhanced if the channel region is made of a semiconductor material having a strained crystalline lattice (such as, for example, a silicon/germanium material having a strained lattice, or a silicon material having a strained lattice) formed over a semiconductor material having a relaxed lattice (such as, for example, a silicon/germanium material having a relaxed crystalline lattice). (See, for example, Rim, K. et al., "Strained Si NMOSFETs for High Performance CMOS Technology", VLSI Tech. Digest, 2001, p. 59–60; Cheng, Z. et al., "SiGe-On-Insulator (SGOI) Substrate Preparation and MOSFET Fabrication for Electron Mobility Evaluation" 2001 IEEE SOI Conference Digest, October 2001, pp. 13–14; Huang, L. J. et al., "Carrier Mobility Enhancement in Strained Si-on-Insulator Fabricated by Wafer Bonding", VLSI Tech. Digest, 2001, pp. 57–58; and Mizuno, T. et al., "High Performance CMOS Operation of Strained-SOI MOSFETs Using Thin Film SiGe-on-Insulator Substrate", VLSI Tech. Digest, 2002, p. 106–107.)

The terms "relaxed crystalline lattice" and "strained crystalline lattice" are utilized to refer to crystalline lattices which are within a defined lattice configuration for the semiconductor material, or perturbed from the defined lattice configuration, respectively. In applications in which the relaxed lattice material comprises silicon/germanium having a germanium concentration of from 10% to 60%, mobility enhancements of 110% for electrons and 60–80% for holes can be accomplished by utilizing a strained lattice material in combination with the relaxed lattice material (see for example, Rim, K. et al., "Characteristics and Device Design of Sub-100 nm Strained SiN and PMOSFETs", VLSI Tech. Digest, 2002, 00. 98–99; and Huang, L. J. et al., "Carrier Mobility Enhancement in Strained Si-on-Insulator Fabricated by Wafer Bonding", VLSI Tech. Digest, 2001, pp. 57–58).

Performance enhancements of standard field effect transistor devices are becoming limited with progressive lithographic scaling in conventional applications. Accordingly, strained-lattice-channeled-field effect transistors on relaxed silicon/germanium offers an opportunity to enhance device performance beyond that achieved through conventional lithographic scaling. IBM recently announced the world's fastest communications chip following the approach of utilizing a strained crystalline lattice over a relaxed crystalline lattice (see, for example, "IBM Builds World's Fastest Communications Microchip", Reuters U.S. Company News, Feb. 25, 2002; and Markoff, J., "IBM Circuits are Now Faster and Reduce Use of Power", The New York Times, Feb. 25, 2002).

Although various techniques have been developed for substantially controlling nucleation and grain growth processes of semiconductor materials, grain orientation control is lacking. Further, the post-anneal treatment utilized in conjunction with MILC can be unsuitable in applications in which a low thermal budget is desired. Among the advantages of the invention described below is that such can allow substantial control of crystal grain orientation within a semiconductor material, while lowering thermal budget requirements relative to conventional methods. Additionally, the quality of the grown crystal formed from a semiconductor material can be improved relative to that of conventional methods.

In further aspects of the prior art, it is a continuing goal to reduce the area of various semiconductor constructions, especially logic building blocks, while maintaining suitable performance characteristics and wireability. Among the semiconductor constructions for which it would be desired to reduce device area are basic logic building block constructions, such as, for example, NOR constructions and NAND constructions, as well as higher level logic blocks, namely registers or latches, such as, for example, flip-flops. Additionally, it would be desired to improve wireability to reduce interconnect delays, and thereby improve logic device performance.

SUMMARY OF THE INVENTION

In one aspect, the invention encompasses a logic construction. The construction includes a pair of first transistor devices having first active regions extending into a first semiconductive material. The construction also includes a second semiconductive material over the first transistor devices, and a pair of second transistor devices having second active regions extending into the second semiconductive material. At least one of the first and second semiconductive materials comprises Si/Ge, and in particular aspects at least one of the first and second semiconductive materials can be crystalline. Further, the active regions of the pair of first transistor devices within the crystalline Si/Ge material can be within a single crystal of the material. Also, the active regions of the pair of second transistor devices within the crystalline Si/Ge semiconductive material can be within a single crystal of the material. In particular aspects, the logic construction can include a NOR circuit, and in further aspects the construction can comprise a pair of NOR circuits in a cross-coupled latch. In other aspects, the construction can comprise a NAND circuit.

The logic construction can be incorporated into electronic devices, such as, for example, processor devices and computer systems.

BRIEF DESCRIPTION OF THE DRAWINGS

Preferred embodiments of the invention are described below with reference to the following accompanying drawings.

FIG. 7 is an expanded region of the FIG. 6 fragment shown at a processing stage subsequent to that of FIG. 6 in accordance with an exemplary embodiment of the present invention, and shows an NMOS device.

FIG. 8 is a view of the FIG. 7 fragment shown at a processing stage subsequent to that of FIG. 7.

DETAILED DESCRIPTION OF THE PREFERRED EMBODIMENTS

The invention pertains to logic devices. Exemplary logic devices are described with reference to FIGS. 10–17. Prior to the discussion of the exemplary logic devices, a processing sequence for forming and utilizing preferred TFT-based Si/Ge materials and device structures is described with reference to FIGS. 1–9.

Figure 1:
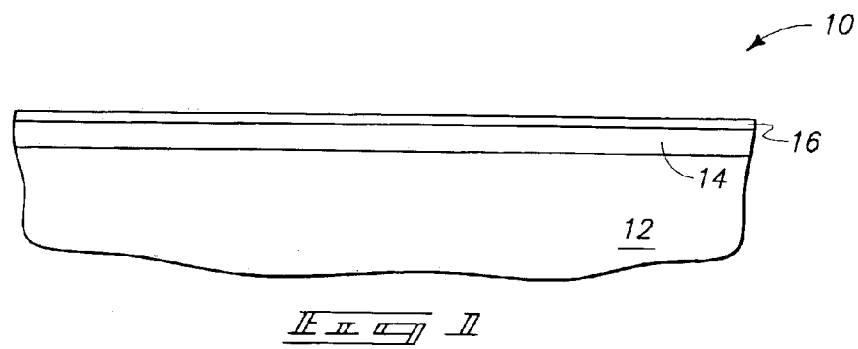
FIG. 1 is a diagrammatic, cross-sectional view of a fragment of a semiconductor construction shown at a preliminary stage of an exemplary process of the present invention.

Referring to FIG. 1, a fragment of a semiconductor construction 10 is illustrated at a preliminary processing stage. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Construction 10 comprises a base (or substrate) 12 and an insulator layer 14 over the base. Base 12 can comprise, for example, one or more of glass, aluminum oxide, silicon dioxide, metal and plastic. Additionally, and/or alternatively, base 12 can comprise a semiconductor material, such as, for example, a silicon wafer.

Layer 14 comprises an electrically insulative material, and in particular applications can comprise, consist essentially of, or consist of silicon dioxide. In the shown construction, insulator layer 14 is in physical contact with base 12. It is to be understood, however, that there can be intervening materials and layers provided between base 12 and layer 14 in other aspects of the invention (not shown). For example, a chemically passive thermally stable material, such as silicon nitride ($Si_3N_4$), can be incorporated between base 12 and layer 14. Layer 14 can have a thickness of, for example, from about 200 nanometers to about 500 nanometers, and can be referred to as a buffer layer.

Layer 14 preferably has a planarized upper surface. The planarized upper surface can be formed by, for example, chemical-mechanical polishing.

A layer 16 of semiconductive material is provided over insulator layer 14. In the shown embodiment, semiconductive material layer 16 is formed in physical contact with insulator 14. Layer 16 can have a thickness of, for example, from about 5 nanometers to about 10 nanometers. Layer 16 can, for example, comprise, consist essentially of, or consist of either doped or undoped silicon. If layer 16 comprises, consists essentially of, or consists of doped silicon, the dopant concentration can be from about $10^{14}$ atoms/$cm^3$ to about $10^{20}$ atoms/$cm^3$. The dopant can be either n-type or p-type, or a combination of n-type and p-type.

The silicon utilized in layer 16 can be either polycrystalline silicon or amorphous silicon at the processing stage of FIG. 1. It can be advantageous to utilize amorphous silicon in that it is typically easier to deposit a uniform layer of amorphous silicon than to deposit a uniform layer of polycrystalline silicon.

Figure 2:
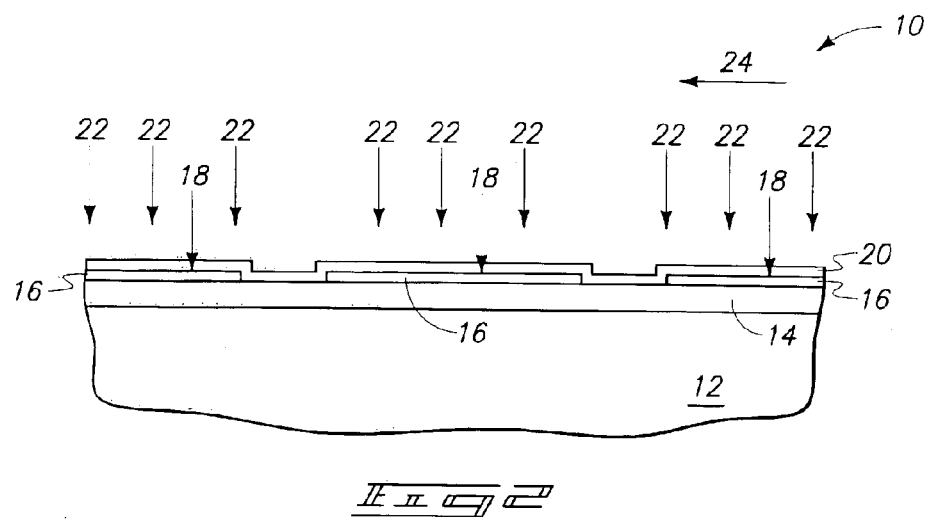
FIG. 2 is a view of the FIG. 1 fragment shown at a processing stage subsequent to that of FIG. 1.

Referring to FIG. 2, material 16 is patterned into a plurality of discrete islands (or blocks) 18. Such can be accomplished utilizing, for example, photoresist (not shown) and photolithographic processing, together with an appropriate etch of material 16.

A capping layer 20 is provided over islands 18 and over portions of layer 14 exposed between the islands. Layer 20 can, for example, comprise, consist essentially of, or consist of one or both of silicon dioxide and silicon. Layer 20 can also comprise multiple layers of silicon dioxide, stress-free silicon oxynitride, and silicon.

After formation of capping layer 20, small voids (nanovoids) and small crystals are formed in the islands 18. The formation of the voids and crystals can be accomplished by ion implanting helium 22 into material 16 and subsequently exposing material 16 to laser-emitted electromagnetic radiation. The helium can aid in formation of the nanovoids; and the nanovoids can in turn aid in crystallization and stress relief within the material 16 during exposure to the electromagnetic radiation. The helium can thus allow crystallization to occur at lower thermal budgets than can be achieved without the helium implantation. The helium is preferably implanted selectively into islands 18 and not into regions between the islands. The exposure of construction 10 to electromagnetic radiation can comprise subjecting the construction to scanned continuous wave laser irradiation while the construction is held at an appropriate elevated temperature (typically from about 300° C. to about 450° C.). The exposure to the electromagnetic radiation can complete formation of single crystal seeds within islands 18. The laser irradiation is scanned along an axis 24 in the exemplary shown embodiment.

The capping layer 20 discussed previously is optional, but can beneficially assist in retaining helium within islands 18 and/or preventing undesirable impurity contamination during the treatment with the laser irradiation.

Figure 3:
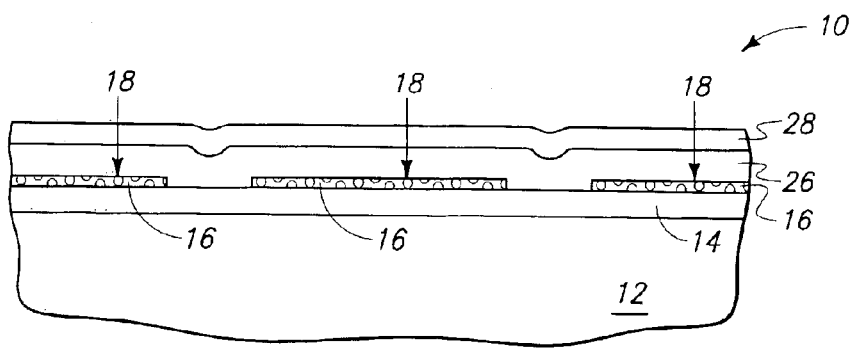
FIG. 3 is a view of the FIG. 1 fragment shown at a processing stage subsequent to that of FIG. 2.

Referring to FIG. 3, islands 18 are illustrated after voids have been formed therein. Additionally, small crystals (not shown) have also been formed within islands 18 as discussed above.

Capping layer 20 (FIG. 2) is removed, and subsequently a layer 26 of semiconductive material is formed over islands 18. Layer 26 can comprise, consist essentially of, or consist of silicon and germanium; or alternatively can comprise, consist essentially of, or consist of doped silicon/germanium. The germanium concentration within layer 26 can be, for example, from about 10 atomic percent to about 60 atomic percent. In the shown embodiment, layer 26 physically contacts islands 18, and also physically contacts insulator layer 14 in gaps between the islands. Layer 26 can be formed to a thickness of, for example, from about 50 nanometers to about 100 nanometers, and can be formed utilizing a suitable deposition method, such as, for example, plasma-assisted chemical vapor deposition.

A capping layer 28 is formed over semiconductor layer 26. Capping layer 28 can comprise, for example, silicon dioxide. Alternatively, capping layer 28 can comprise, for example, a combination of silicon dioxide and stress-free silicon oxynitride. Capping layer 28 can protect a surface of layer 26 from particles and contaminants that could otherwise fall on layer 26. If the processing of construction 10 occurs in an environment in which particle formation and/or incorporation of contaminants is unlikely (for example, an ultrahigh vacuum environment), layer 28 can be eliminated from the process. Layer 28 is utilized in the patterning of a metal (discussed below). If layer 28 is eliminated from the process, other methods besides those discussed specifically herein can be utilized for patterning the metal.

Figure 4:
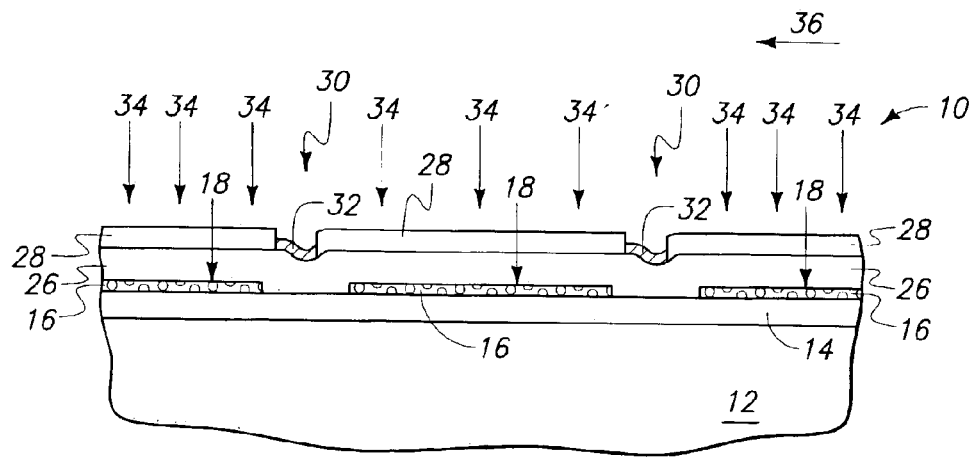
FIG. 4 is a view of the FIG. 1 fragment shown at a processing stage subsequent to that of FIG. 3.

Referring to FIG. 4, openings 30 are extended through capping layer 28 and to an upper surface of semiconductive material 26. Openings 30 can be formed by, for example, photolithographic processing to pattern a layer of photoresist (not shown) into a mask, followed by a suitable etch of layer 28 and subsequent removal of the photoresist mask.

A layer 32 of metal-containing material is provided within openings 30, and in physical contact with an upper surface of semiconductive material 26. Layer 32 can have a thickness of, for example, less than or equal to about 10 nanometers. The material of layer 32 can comprise, consist essentially of, or consist of, for example, nickel. Layer 32 can be formed by, for example, physical vapor deposition. Layer 32 can be formed to be within openings 30 and not over material 28 (as is illustrated in FIG. 4) by utilizing deposition conditions which selectively form metal-containing layer 32 on a surface of material 26 relative to a surface of material 28. Alternatively, material 32 can be deposited by a substantially non-selective process to form the material 32 over the surface of material 28 as well as over the surface of material 26 within openings 30, and subsequently material 32 can be selectively removed from over surfaces of material 28 while remaining within openings 30. Such selective removal can be accomplished by, for example, chemical-mechanical polishing, and/or by forming a photoresist mask (not shown) over the material 32 within openings 30, while leaving other portions of material 32 exposed, and subsequently removing such other portions to leave only the segments of material 32 within openings 30. The photoresist mask can then be removed.

Oxygen 34 is ion implanted through layers 26 and 28, and into layer 16 to oxidize the material of layer 16. For instance, if layer 16 consists of silicon, the oxygen can convert the silicon to silicon dioxide. Such swells the material of layer 16, and accordingly fills the nanovoids that had been formed earlier. The oxygen preferably only partially oxidizes layer 16, with the oxidation being sufficient to fill all, or at least substantially all, of the nanovoids; but leaving at least some of the seed crystals within layer 16 that had been formed with the laser irradiation discussed previously. In some aspects, the oxidation can convert a lower portion of material 16 to silicon dioxide while leaving an upper portion of material 16 as non-oxidized silicon.

The oxygen ion utilized as implant 34 can comprise, for example, oxygen ($O_2$) or ozone ($O_3$). The oxygen ion implant can occur before or after formation of openings 30 and provision of metal-containing layer 32.

Construction 10 is exposed to continuous wave laser irradiation while being held at an appropriate temperature (which can be, for example, from about 300° C. to about 450° C.; or in particular applications can be greater than or equal to 550° C.) to cause transformation of at least some of layer 26 to a crystalline form. The exposure to the laser irradiation comprises exposing the material of construction 10 to laser-emitted electromagnetic radiation scanned along a shown axis 36. Preferably, the axis 36 along which the laser irradiation is scanned is the same axis that was utilized for scanning of laser irradiation in the processing stage of FIG. 2.

The crystallization of material 26 (which can also be referred to as a recrystallization of the material) is induced utilizing metal-containing layer 32, and accordingly corresponds to an application of MILC. The MILC transforms material 26 to a crystalline form and the seed layer provides the crystallographic orientation while undergoing partial oxidation.

The crystal orientation within crystallized layer 26 can originate from the crystals initially formed in islands 18. Accordingly, crystal orientations formed within layer 26 can be controlled through control of the crystal orientations formed within the semiconductive material 16 of islands 18.

The oxidation of part of material 16 which was described previously can occur simultaneously with the MILC arising from continuous wave laser irradiation. Partial oxidation of seed layer 16 facilitates: (1) Ge enrichment into Si—Ge layer 26 (which improves carrier mobility); (2) stress-relief of Si—Ge layer 26; and (3) enhancement of recrystallization of Si—Ge layer 26. The crystallization of material 26 can be followed by an anneal of material 26 at a temperature of, for example, about 900° C. for a time of about 30 minutes, or by an appropriate rapid thermal anneal, to further ensure relaxed, defect-free crystallization of material 26. The annealing option can be dependent on the thermal stability of the material selected for substrate 12.

Figure 5:
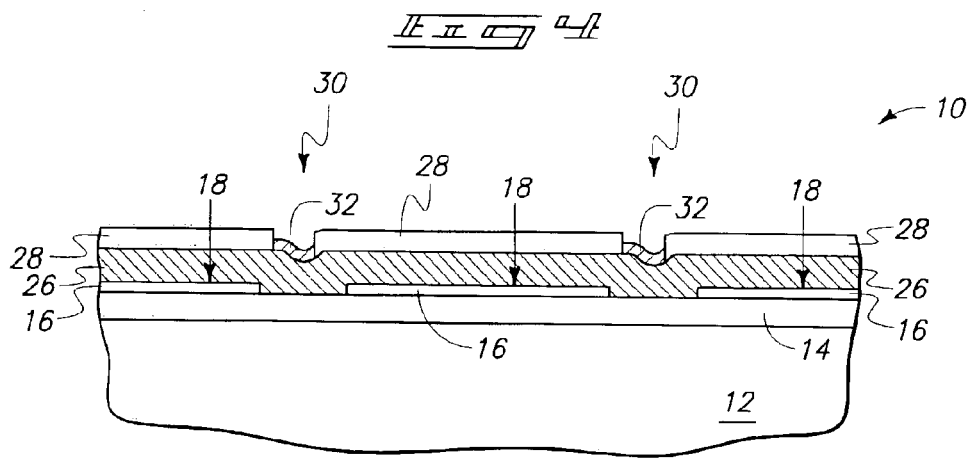
FIG. 5 is a view of the FIG. 1 fragment shown at a processing stage subsequent to that of FIG. 4.

FIG. 5 shows construction 10 after the processing described above with reference to FIG. 4. Specifically, the voids that had been in material 16 are absent due to the oxidation of material 16. Also, semiconductive material 26 has been transformed into a crystalline material (illustrated diagrammatically by the cross-hatching of material 26 in FIG. 5). Crystalline material 26 can consist of a single large crystal, and accordingly can be monocrystalline. Alternatively, crystalline material 26 can be polycrystalline. If crystalline material 26 is polycrystalline, the crystals of the material will preferably be equal in size or larger than the blocks 18. In particular aspects, each crystal of the polycrystalline material can be about as large as one of the shown islands 18. Accordingly, the islands can be associated in a one-to-one correspondence with crystals of the polycrystalline material.

The shown metal layers 32 are effectively in a one-to-one relationship with islands 18, and such one-to-one correspondence of crystals to islands can occur during the MILC. Specifically, single crystals can be generated relative to each of islands 18 during the MILC process described with reference to FIG. 4. It is also noted, however, that although the metal layers 32 are shown in a one-to-one relationship with the islands in the cross-sectional views of FIGS. 4 and 5, the construction 10 comprising the shown fragment should be understood to extend three dimensionally. Accordingly, the islands 18 and metal layers 32 can extend in directions corresponding to locations into and out of the page relative to the shown cross-sectional view. There can be regions of the construction which are not shown where a metal layer overlaps with additional islands besides the shown islands.

Figure 6:
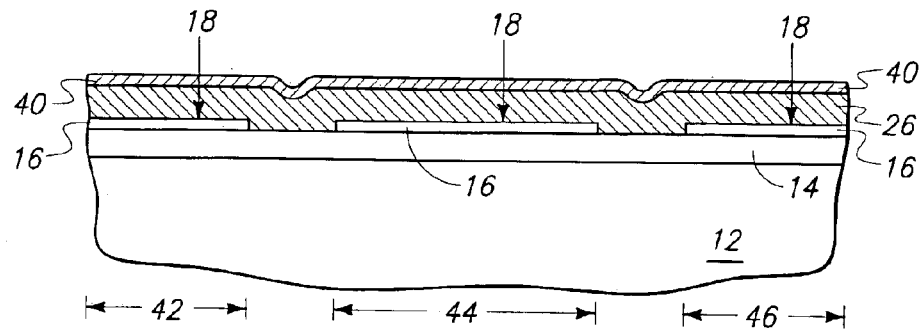
FIG. 6 is a view of the FIG. 1 fragment shown at a processing stage subsequent to that of FIG. 5.

Referring to FIG. 6, layers 28 and 32 (FIG. 5) are removed, and subsequently a layer 40 of crystalline semiconductive material is formed over layer 26. In typical applications, layer 26 will have a relaxed crystalline lattice and layer 40 will have a strained crystalline lattice. As discussed previously, layer 26 will typically comprise both silicon and germanium, with the germanium being present to a concentration of from about 10 atomic percent to about 60 atomic percent. Layer 40 can comprise, consist essentially of, or consist of either doped or undoped silicon; or alternatively can comprise, consist essentially of, or consist of either doped or undoped silicon/germanium. If layer 40 comprises silicon/germanium, the germanium content can be from about 10 atomic percent to about 60 atomic percent.

Strained lattice layer 40 can be formed by utilizing methods similar to those described in, for example, Huang, L. J. et al., "Carrier Mobility Enhancement in Strained Si-on-Insulator Fabricated by Wafer Bonding", VLSI Tech. Digest, 2001, pp. 57–58; and Cheng, Z. et al., "SiGe-On-Insulator (SGOI) Substrate Preparation and MOSFET Fabrication for Electron Mobility Evaluation" 2001 IEEE SOI Conference Digest, October 2001, pp. 13–14.

Strained lattice layer 40 can be large polycrystalline or monocrystalline. If strained lattice layer 40 is polycrystalline, the crystals of layer 40 can be large and in a one-to-one relationship with the large crystals of a polycrystalline relaxed crystalline layer 26. Strained lattice layer 40 is preferably monocrystalline over the individual blocks 18.

The strained crystalline lattice of layer 40 can improve mobility of carriers relative to the material 26 having a relaxed crystalline lattice. However, it is to be understood that layer 40 is optional in various aspects of the invention.

Each of islands 18 can be considered to be associated with a separate active region 42, 44 and 46. The active regions can be separated from one another by insulative material subsequently formed through layers 26 and 40 (not shown). For instance, a trenched isolation region can be formed through layers 26 and 40 by initially forming a trench extending through layers 26 and 40 to insulative material 14, and subsequently filling the trench with an appropriate insulative material such as, for example, silicon dioxide.

As discussed previously, crystalline material 26 can be a single crystal extending across an entirety of the construction 10 comprising the shown fragment, and accordingly extending across all of the shown active regions. Alternatively, crystalline material 26 can be polycrystalline. If crystalline material 26 is polycrystalline, the single crystals of the polycrystalline material will preferably be large enough so that only one single crystal extends across a given active region. In other words, active region 42 will preferably comprise a single crystal of material 26, active region 44 will comprise a single crystal of the material, and active region 46 will comprise a single crystal of the material, with the single crystals being separate and discrete relative to one another.

FIG. 7 shows an expanded view of active region 44 at a processing stage subsequent to that of FIG. 6, and specifically shows a transistor device 50 associated with active region 44 and supported by crystalline material 26.

Transistor device 50 comprises a dielectric material 52 formed over strained lattice 40, and a gate 54 formed over dielectric material 52. Dielectric material 52 typically comprises silicon dioxide, and gate 54 typically comprises a stack including an appropriate conductive material, such as, for example, conductively-doped silicon and/or metal.

A channel region 56 is beneath gate 54, and in the shown construction extends across strained crystalline lattice material 40. The channel region may also extend into relaxed crystalline lattice material 26 (as shown). Channel region 56 is doped with a p-type dopant.

Transistor construction 50 additionally comprises source/drain regions 58 which are separated from one another by channel region 56, and which are doped with n-type dopant to an n$^+$ concentration (typically, a concentration of at least $10^{21}$ atoms/cm$^3$). In the shown construction, source/drain regions 58 extend across strained lattice layer 40 and into relaxed lattice material 26. Although source/drain regions 58 are shown extending only partially through relaxed lattice layer 26, it is to be understood that the invention encompasses other embodiments (not shown) in which the source/drain regions extend all the way through relaxed material 26 and to material 16.

Channel region 56 and source/drain regions 58 can be formed by implanting the appropriate dopants into crystalline materials 26 and 40. The dopants can be activated by rapid thermal activation (RTA), which can aid in keeping the thermal budget low for fabrication of field effect transistor 50.

An active region of transistor device 50 extends across source/drain regions 58 and channel region 56. Preferably the portion of the active region within crystalline material 26 is associated with only one single crystal of material 26. Such can be accomplished by having material 26 be entirely monocrystalline. Alternatively, material 26 can be polycrystalline and comprise an individual single grain which accommodates the entire portion of the active region that is within material 26. The portion of strained lattice material 40 that is encompassed by the active region is preferably a single crystal, and can, in particular aspects, be considered an extension of the single crystal of the relaxed lattice material 26 of the active region.

Crystalline materials 40 and 26 can, together with any crystalline structures remaining in material 16, have a total thickness of less than or equal to about 2000 Å. Accordingly the crystalline material can correspond to a thin film formed over an insulative material. The insulative material can be considered to be insulative layer 14 alone, or a combination of insulative layer 14 and oxidized portions of material 16.

The transistor structure 50 of FIG. 7 corresponds to an n-type field effect transistor (NFET), and in such construction it can be advantageous to have strained crystalline material 40 consist of a strained silicon material having appropriate dopants therein. The strained silicon material can improve mobility of electrons through channel region 56, which can improve performance of the NFET device relative to a device lacking the strained silicon lattice. Although it can be preferred that strained lattice material 40 comprise silicon in an NFET device, it is to be understood that the strained lattice can also comprise other semiconductive materials. A strained silicon lattice can be formed by various methods. For instance, strained silicon could be developed by various means and lattice 40 could be created by lattice mismatch with other materials or by geometric conformal lattice straining on another substrate (mechanical stress).

As mentioned above, strained lattice 40 can comprise other materials alternatively to, or additionally to, silicon. The strained lattice can, for example, comprise a combination of silicon and germanium. There can be advantages to utilizing the strained crystalline lattice comprising silicon and germanium relative to structures lacking any strained lattice. However, it is generally most preferable if the strained lattice consists of silicon alone (or doped silicon), rather than a combination of silicon and germanium for an NFET device.

A pair of sidewall spacers 60 are shown formed along sidewalls of gate 54, and an insulative mass 62 is shown extending over gate 54 and material 40. Conductive interconnects 63 and 64 extend through the insulative mass 62 to electrically connect with source/drain regions 58. Interconnects 63 and 64 can be utilized for electrically connecting transistor construction 50 with other circuitry external to transistor construction 50. Such other circuitry can include, for example, a bitline and a capacitor in applications in which construction 50 is incorporated into dynamic random access memory (DRAM).

FIG. 8 shows construction 10 at a processing stage subsequent to that of FIG. 7, and shows a capacitor structure 90 formed over and in electrical contact with conductive interconnect 64. The shown capacitor structure extends across gate 54 and interconnect 63.

Capacitor construction 90 comprises a first capacitor electrode 92, a second capacitor electrode 94, and a dielectric material 96 between capacitor electrodes 92 and 94. Capacitor electrodes 92 and 94 can comprise any appropriate conductive material, including, for example, conductively-doped silicon. In particular aspects, electrodes 92 and 94 will each comprise n-type doped silicon, such as, for example, polycrystalline silicon doped to a concentration of at least about $10^{21}$ atoms/cm$^3$ with n-type dopant. In a particular aspect of the invention, electrode 92, conductive interconnect 64 and the source/drain region 58 electrically connected with interconnect 64 comprise, or consist of, n-type doped semiconductive material. Accordingly, n-type doped semiconductive material extends from the source/drain region, through the interconnect, and through the capacitor electrode.

Dielectric material 96 can comprise any suitable material, or combination of materials. Exemplary materials suitable for dielectric 106 are high dielectric constant materials including, for example, silicon nitride, aluminum oxide, $TiO_2$, $Ta_2O_5$, $ZrO_2$, etc.

The conductive interconnect 63 is in electrical connection with a bitline 97. Top capacitor electrode 94 is shown in electrical connection with an interconnect 98, which in turn connects with a reference voltage 99, which can, in particular aspects, be ground. The construction of FIG. 8 can be considered a DRAM cell, and such can be incorporated into an electronic system (such as, for example, a computer system) as a memory device.

Figure 9:
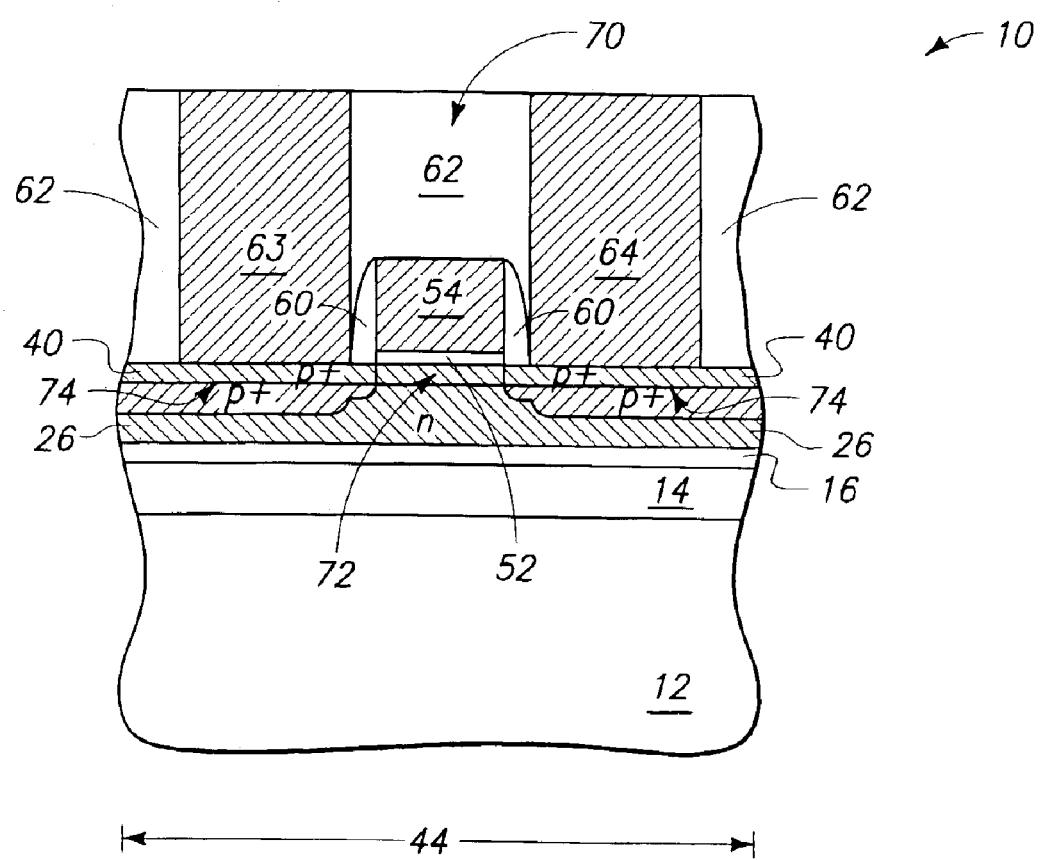
FIG. 9 is a view of an expanded region of FIG. 6 shown at a processing stage subsequent to that of FIG. 6 in accordance with an alternative embodiment relative to that of FIG. 7, and shows a PMOS device.

FIG. 9 shows construction 10 at a processing stage subsequent to that of FIG. 6 and alternative to that described previously with reference to FIG. 7. In referring to FIG. 9, similar numbering will be used as is used above in describing FIG. 7, where appropriate.

A transistor construction 70 is shown in FIG. 9, and such construction differs from the construction 50 described above with reference to FIG. 7 in that construction 70 is a p-type field effect transistor (PFET) rather than the NFET of FIG. 7. Transistor device 70 comprises an n-type doped channel region 72 and p$^+$-doped source/drain regions 74. In other words, the channel region and source/drain regions of transistor device 70 are oppositely doped relative to the channel region and source/drain regions described above with reference to the NFET device 50 of FIG. 7.

The strained crystalline lattice material 40 of the PFET device 70 can consist of appropriately doped silicon, or consist of appropriately doped silicon/germanium. It can be most advantageous if the strained crystalline lattice material 40 comprises appropriately doped silicon/germanium in a PFET construction, in that silicon/germanium can be a more effective carrier of holes with higher mobility than is silicon without germanium.

Devices similar to the transistor devices discussed above (NFET device 50 of FIG. 7, and PFET device 70 of FIG. 9) can be utilized in numerous constructions. For instance, similar devices can be utilized in logic devices.

Figure 10:
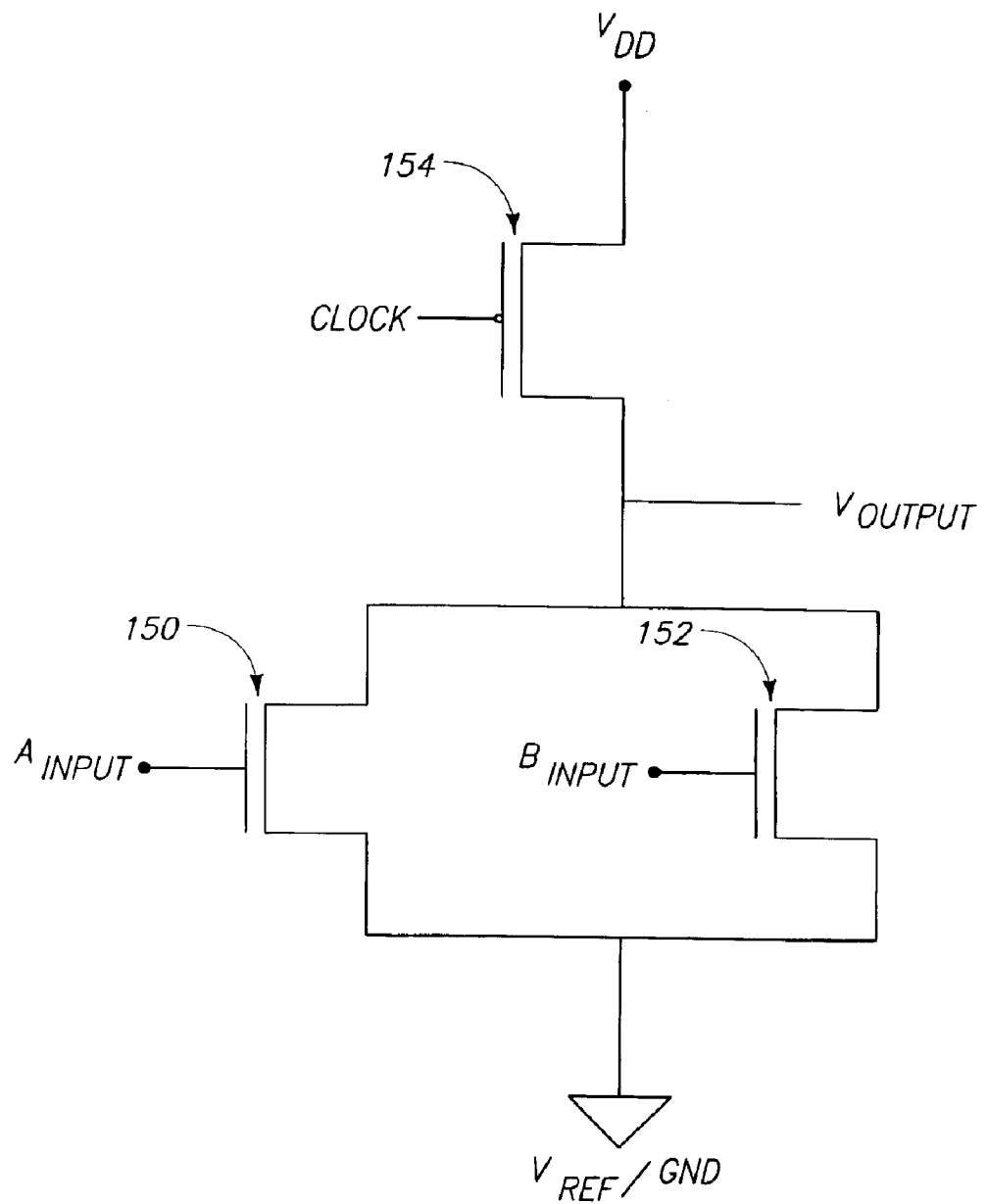
FIG. 10 illustrates a circuit schematic of an exemplary NOR logic construction according to an aspect of the present invention.

Exemplary logic devices incorporating methodology of FIGS. 1–9 are described in FIGS. 10–17. Referring initially to FIG. 10, such illustrates a circuit schematic of a two-input NOR logic construction. The construction includes a pair of NFET transistors 150 and 152 connected in parallel providing the two inputs, and also includes a PFET transistor 154 in series with the NFET pair to provide clocking. A first input "A" is provided to a gate of NFET device 150, and a second input "B" is provided to the transistor gate of NFET device 152. Additionally, a clock input is provided to the gate of PFET device 154. The NFET devices connect with one source/drain of the PFET device by the logic output node, and are between the PFET device (connected between $V_{DD}$ and the logic output) and $V_{REF}$/GND. The other source/drain of the PFET device connects to $V_{DD}$.

Figure 11:
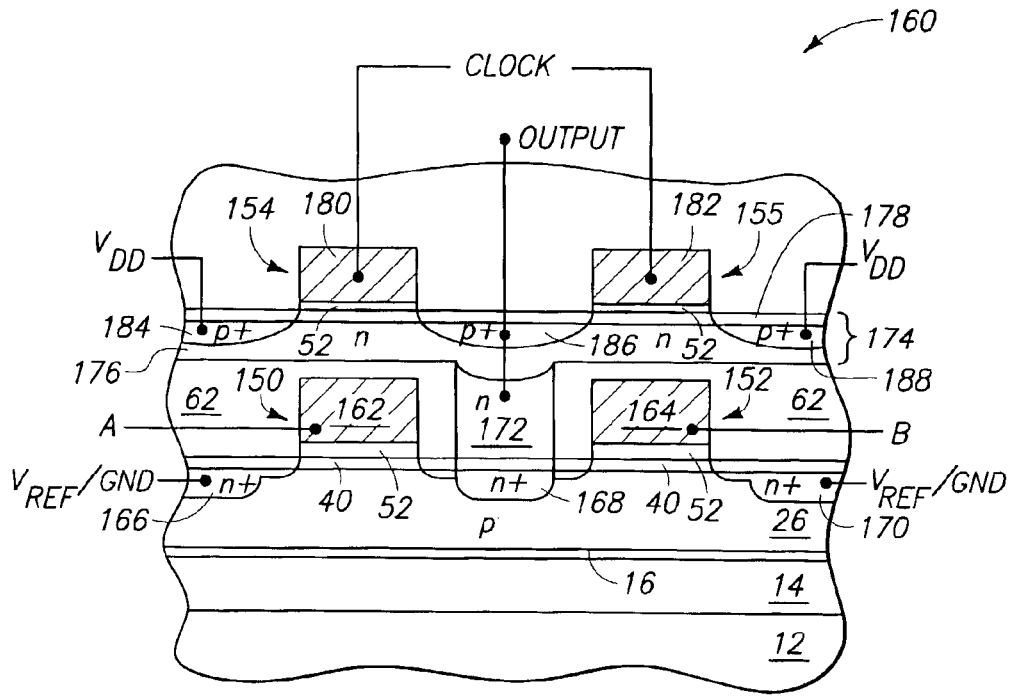
FIG. 11 is a fragmentary, diagrammatic cross-sectional side view of an exemplary NOR logic construction according to an aspect of the present invention.

FIG. 11 is a cross-sectional view of an exemplary construction corresponding to the circuit described above with reference to FIG. 10. The construction of FIG. 11 is referred to generally as 160. In referring to construction 160, similar numbering will be used as was utilized above in describing the constructions of FIGS. 1–9, where appropriate. In the specific construct of FIG. 11, the PFET device of FIG. 10 is split into two "half-width" PFET devices 154 and 155 connected in parallel to provide the logical equivalent of the whole PFET device of FIG. 10. Such can allow layout density and symmetry of the NOR logic building block to be achieved, as well as improve performance and wireability. One aspect of the potential improvement in performance obtained by utilizing methodologies of the present invention, is that such methodologies can reduce the amount and complexity of wiring. Such reduction can remove interconnect delay and other delays associated with wiring, which can translate into enhanced speed.

Construction 160 includes substrate 12, insulative material 14, and layers 16, 26 and 40 of the above-described constructions of FIGS. 1–9. Substrate 12 can comprise, for example, a semiconductive material (such as, for example, a monocrystalline silicon wafer), glass, aluminum oxide, silicon dioxide, metal and/or plastic. Insulative material 14 can comprise, for example, silicon nitride and/or silicon dioxide. Layers 16, 26 and 40 can comprise silicon dioxide and/or silicon seed crystals, Si/Ge in a relaxed crystalline lattice, and Si in a strained crystalline lattice, respectively. Further, layer 40 can, in particular aspects, comprise Si/Ge in a strained crystalline lattice.

Construction 160 further includes a pair of NFET devices 150 and 152. The NFET devices comprise gates 162 and 164, respectively, over layer 40 and separated from layer 40 by gate oxide 52.

NFET device 150 comprises source/drain regions 166 and 168 extending into layers 26 and 40, and NFET device 164 comprises source/drain regions 168 and 170 extending into layers 26 and 40. Source/drain region 168 is common to devices 150 and 152, and can be considered a shared source/drain region. As source/drain region 168 is shared between devices 150 and 152, the devices have overlapping active regions. The overlapping active regions include the source/drain regions, and channel regions beneath gates 162 and 164 and extending between the source/drain regions. In particular aspects, an entirety of the overlapping active regions within layer 26 is contained within a single crystal of layer 26, and an entirety of the overlapping active regions within layer 40 is contained within a single crystal of layer 40. Layers 26 and 40 can, as discussed above with reference to the embodiments of FIGS. 1–9, comprise polycrystalline or monocrystalline materials.

NFET constructions 150 and 152 are similar to the NFET construction 50 described with reference to FIG. 7, and can be formed utilizing methodology analogous to that described previously for forming the construction of FIG. 7. It is noted that the layers 26 and 40 are shown with cross-hatching in FIG. 7 to indicate that such layers are conductive, whereas the layers 26 and 40 are not shown with cross-hatching in FIG. 11. The cross-hatching is not shown in FIG. 11 in order to simplify the drawing, but it is to be understood that the layers 26 and 40 of FIG. 11 are similarly conductive to the layers 26 and 40 described above with reference to FIG. 7.

A conductive pedestal 172 extends upwardly from shared source/drain region 168. Pedestal 172 is in electrical connection with source/drain region 168, and in particular aspects comprises n-type doped semiconductive material, such as, for example, n-type doped silicon or n-type doped silicon/germanium. Pedestal 172 joins a construction 174 which supports PFET devices 154 and 155, and acts as a substrate for the "half-width" devices. Construction 174 comprises a layer 176 of semiconductive material. Layer 176 can comprise, consist essentially of, or consist of, for example, n-type doped silicon. In other aspects, layer 176 can comprise, consist essentially of, or consist of n-type doped silicon/germanium, with the germanium being present to a concentration of from about 10 atom % to about 60 atom %. In one aspect of the invention, pedestal 172 is formed by epitaxial growth over crystalline material of layer 40, and subsequently layer 176 is formed by epitaxial growth from pedestal 172.

A layer 178 is formed over layer 176. Layer 178 can comprise, for example, appropriately-doped silicon or appropriately-doped silicon/germanium. In some aspects, layer 176 can comprise a relaxed crystalline lattice and layer 178 can comprise a strained crystalline lattice. Accordingly, layers 176 and 178 can comprise identical constructions to those of the layers 26 and 40, respectively, in some of the above-described embodiments of the invention.

PFET constructions 154 and 155 comprise gates 180 and 182, respectively, with such gates being separated from layer 178 by gate oxide 52.

PFET device 154 comprises p-type doped diffusion regions 184 and 186 extending into layers 176 and 178; and PFET construction 155 comprises source/drain regions 186 and 188 extending into layers 176 and 178. Source/drain region 186 is common to PFET devices 154 and 155, and accordingly can be considered to be shared between the devices, thus forming a parallel pair of "half-width" PFET devices. Devices 154 and 155 have overlapping active regions, and in particular aspects, the entirety of the overlapping active regions within layer 176 can be contained within a single crystal of the material of layer 176, and an entirety of the overlapping active regions within layer 178 can be contained within a single crystal of the material of layer 178.

PFET constructions 154 and 155 are similar to the PFET construction 70 described with reference to FIG. 9, and can be formed utilizing methodology analogous to that described previously for forming the construction of FIG. 9. It is noted that the layers 26 and 40 are shown with cross-hatching in FIG. 9 to indicate that such layers are conductive, whereas the layers 176 and 178 are not shown with cross-hatching in FIG. 11. The cross-hatching is not shown in FIG. 11 in order to simplify the drawing, but it is to be understood that the layers 176 and 178 of FIG. 11 are similarly conductive to the layers 26 and 40 described above with reference to FIG. 9.

An insulative material 62 extends around various of the shown structures to electrically isolate and/or support the structures. Material 62 can comprise, for example, BPSG, $SiO_2$, and/or silicon nitride.

A clock circuit is electrically connected with gates 180 and 182, and $V_{DD}$ is in electrical connection with source/drain regions 184 and 188. Further, $V_{REF}$ is in electrical connection with source/drain regions 166 and 170 of NFET transistor devices 150 and 152. Inputs "A" and "B" are in electrical connection with NFET gates 162 and 164, respectively. An output is in electrical connection with shared PFET source/drain region 186, as well as with the n-type doped semiconductive material of pedestal 172 connecting to the n+ source/drain region 168.

Figure 12:
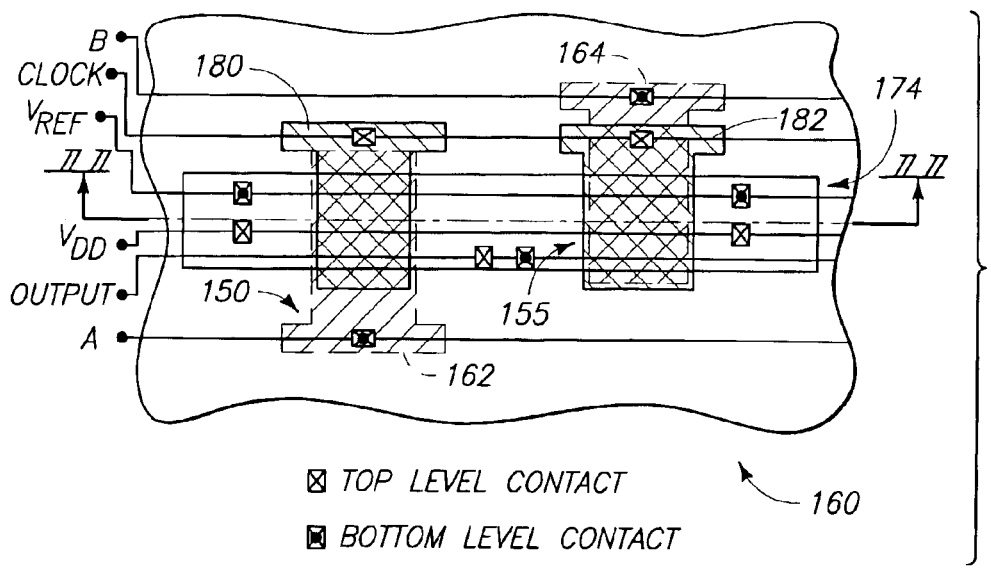
FIG. 12 is a diagrammatic top view of the exemplary NOR logic construction of FIG. 11, with the cross-section of FIG. 11 being along the line 11—11 of FIG. 12.

It is to be understood that various features are shown diagrammatically in FIG. 11 in an effort to simplify the figure. For instance, sidewall spacers would typically be formed along sidewalls of gates 162, 164, 180 and 182. Such sidewall spacers are not shown in the diagrammatic illustration of FIG. 11. Also, gates 162 and 164 would typically comprise multiple layers of conductive materials, with one of the layers being n-type doped silicon; and gates 180 and 182 would typically comprise multiple layers of conductive materials, with one of the layers being p-type doped silicon. The multiple layers are not shown in the gates. Also, it is noted that a lower layer corresponding to a silicon seed layer (analogous to the layer 16 described in the embodiments of FIGS. 1–9), can be formed in the construction 174, although such layer is not present in the shown embodiment FIG. 12 is a diagrammatic top view of the construction 160 and shows the overlap of the PFET gates 180 and 182 relative to the elevationally lower NFET gates 162 and 164. FIG. 12 also represents the orientations of various first metal interconnect wiring layers relative to all appropriate nodes of NFET devices 150 and 152, and PFET devices 154 and 155. It is to be noted that all nodes including the inputs A and B, the output, the $V_{DD}$, and the $V_{REF}$ can all be provided along the same wiring level to demonstrate the dense wireability of such logic construct.

Figure 13:
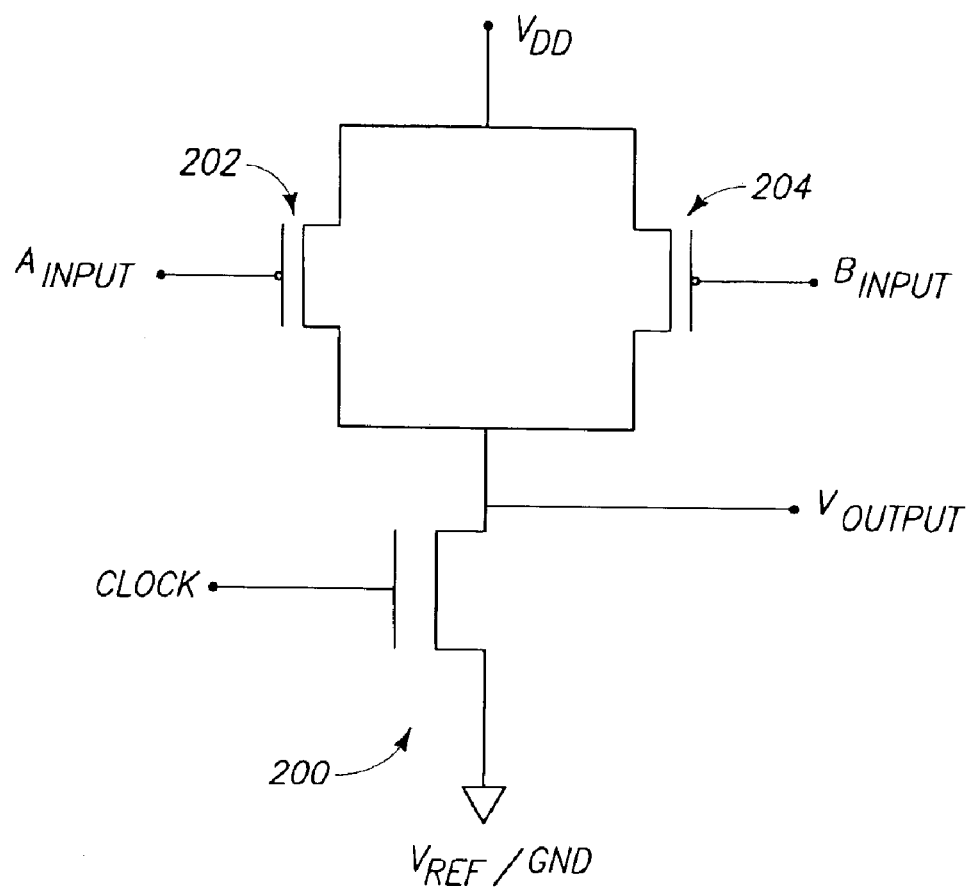
FIG. 13 illustrates a circuit schematic of an exemplary NAND logic construction according to an aspect of the present invention.

Referring next to FIG. 13, such illustrates a circuit schematic of an exemplary two-input NAND logic gate in accordance with an aspect of the present invention. The logic gate comprises a pair of PFET transistor devices 202 and 204 connected in parallel to provide the two inputs (A and B), and an NFET device 200 to provide the clock input and to discharge the output potential node to ground when clocked. Source/drain regions of PFET devices 202 and 204 are in electrical connection with $V_{DD}$ and $V_{output}$. NFET device 200 has a source/drain region in electrical connection with $V_{output}$, and also has a source/drain region in electrical connection the $V_{REF}$/GND. The NAND construction comprises the parallel PFET input pairs connected between the $V_{DD}$ node and the logic output, with the NFET in series between the output and ground.

Figure 14:
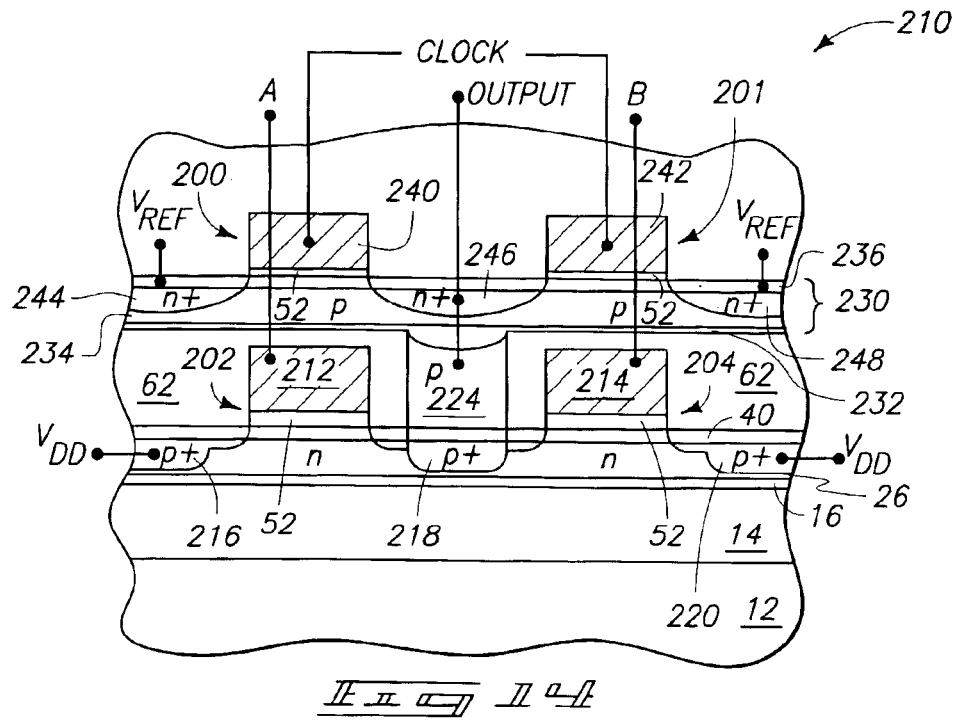
FIG. 14 is a fragmentary, diagrammatic cross-sectional side view of an exemplary NAND logic construction according to an aspect of the present invention.

FIG. 14 is a cross-sectional view of a construction 210 comprising the two-input NAND circuit described with reference to FIG. 13. In referring to construction 210, similar numbering will be used as was used above in describing FIGS. 1–9, where appropriate.

In the specific construct of FIG. 14, the NFET device of the NAND circuit of FIG. 13 is split into two "half-width" NFET devices (200 and 201), connected in parallel to provide the logical equivalent of the whole NFET of FIG. 13. Such can allow layout density and symmetry of the NAND building block to be achieved.

Construction 210 comprises substrate 12, insulative material 14, and layers 16, 26 and 40. PFET devices 202 and 204 comprise gates 212 and 214, respectively, over layer 40. Gates 212 and 214 are separated from layer 40 by gate oxide 52.

PFET device 202 further comprises source/drain regions 216 and 218 extending into layers 40 and 26; and device 204 comprises source/drain regions 218 and 220 extending into layers 26 and 40. Source/drain region 218 is shared between devices 202 and 204. Devices 202 and 204 therefore have overlapping active regions. In particular aspects, the entirety of the overlapping active regions within layer 26 can be within a single crystal of the material of layer 26, and the entirety of the overlapping active regions within layer 40 can be within a single crystal of the material of layer 40. The individual PFET constructions can be identical to the PFET construction 70 described with reference to FIG. 9, and accordingly layer 26 can comprise a relaxed crystalline lattice, and layer 40 can comprise a strained crystalline lattice.

A conductive pedestal 224 extends upwardly from source/drain region 218 to a structure 230. Pedestal 224 can comprise, for example, a conductively-doped semiconductive material, and the shown exemplary pedestal is a p-type doped material. The semiconductive material of pedestal 224 can be, for example, silicon or silicon/germanium. Pedestal 224 can be formed by epitaxial growth from layer 40, and accordingly can comprise a crystalline matrix.

Structure 230 comprises layers 232, 234 and 236. Layers 232, 234 and 236 can comprise identical constructions to the layers 16, 26 and 40 described previously, except that these are doped to be p-type. Accordingly, layers 232, 234 and 236 can comprise silicon seed crystals, silicon/germanium in a relaxed crystalline lattice, and silicon or silicon/germanium in a strained crystalline lattice, respectively. Layers 232, 234 and 236 can be formed over conductive pedestal 224 by epitaxial growth from a crystalline material within pedestal 224.

NFET devices 200 and 201 are supported by structure 230. NFET device 200 comprises a gate 240, and NFET device 201 comprises a gate 242. NFET device 240 further comprises source/drain regions 244 and 246 extending into layers 234 and 236; and NFET device 201 comprises source/drain regions 246 and 248 extending into layers 234 and 236. Source/drain region 246 is shared between devices 200 and 201, and accordingly devices 200 and 201 comprise overlapping active regions. In particular aspects, an entirety of the overlapping active regions within layer 234 is contained within a single crystal of Si/Ge material within layer 234, and an entirety of the overlapping active regions within layer 236 is contained within a single crystal of a strained crystalline material of layer 236.

A clock circuit is in electrical connection with both of the gates 240 and 242 of the NFET devices, and inputs "A" and "B" are in electrical connection with the gates 212 and 214 of the PFET devices. The source/drain regions 244 and 248 of the NFET devices are in electrical connection with $V_{REF}$, while the shared source/drain region 246 is in electrical connection with an output of the logic construction. It is noted that the output is also in electrical connection with the p-type doped semiconductor material of pedestal 224, which in turn connects with source/drain region 218. Source/drain regions 216 and 220 of the PFET devices are in electrical connection with $V_{DD}$.

Figure 15:
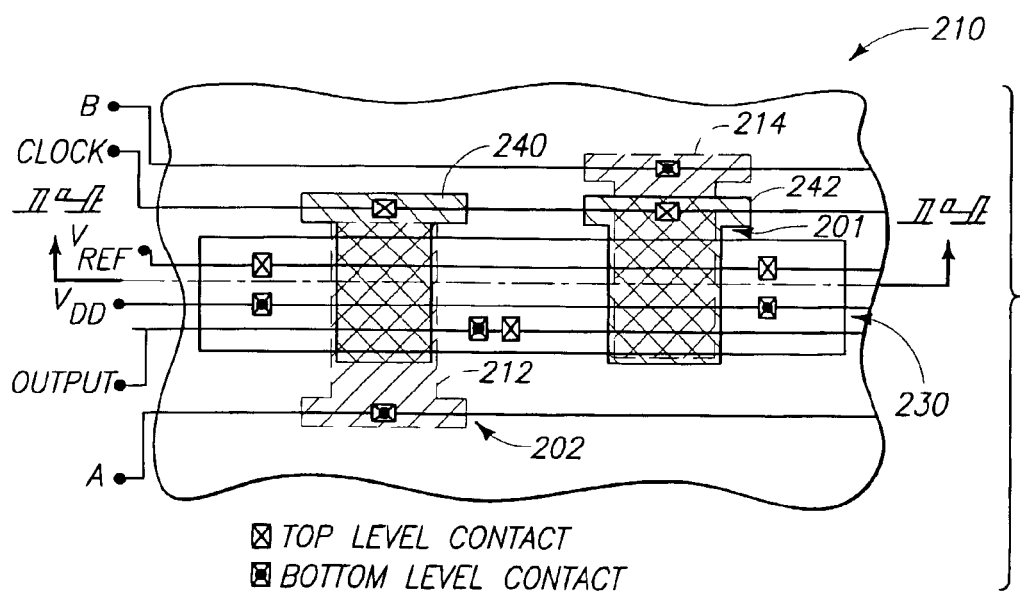
FIG. 15 is a diagrammatic top view of the exemplary NAND logic construction of FIG. 14, with the cross-section of FIG. 14 being along the line 14—14 of FIG. 15.

FIG. 15 is a diagrammatic top view of the construction 210, and illustrates the overlap of NFET devices 200 and 201 relative to the elevationally lower PFET devices 202 and 204. FIG. 15 also represents the orientations of various first level metal wiring interconnect layers relative to all appropriate nodes of PFET devices 202 and 204 as well of the NFET devices 200 and 201. It should be noted that interconnections for all nodes are provided by only one level of metal wiring to demonstrate the dense wireability achievable with such logic construct. Such dense wireability can translate into enhanced performance of the devices by reducing interconnect associated delays.

Figure 16:
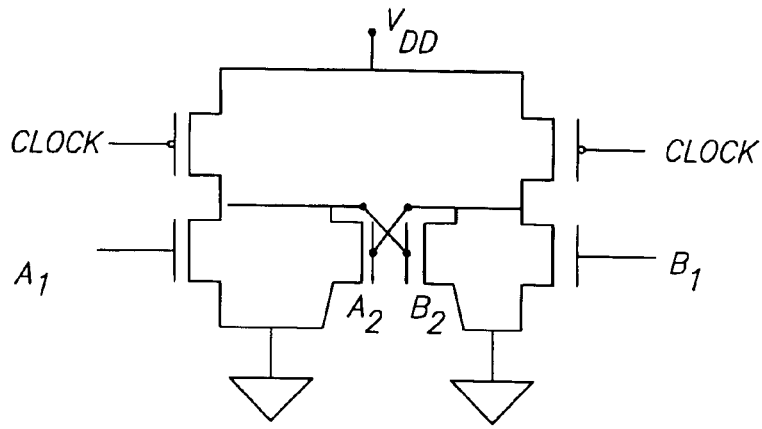
FIG. 16 illustrates a circuit schematic of an exemplary two-NOR cross-coupled latch (flip-flop) logic construction according to an aspect of the present invention.

Referring to FIG. 16, a schematic diagram of a 2-NOR cross-coupled latch (also referred to as a flip-flop) is illustrated as an example of a higher level logic building block. The device comprises two inputs ($A_1$ and $B_1$). The FIG. 16 device can be formed as a combination of devices of the type described in FIG. 10. The flip-flop of FIG. 16 is formed from a pair of NOR circuits of FIG. 10 by cross-coupling the second NFET input gates ($A_2$ and $B_2$) of each NOR circuit.

Figure 17:
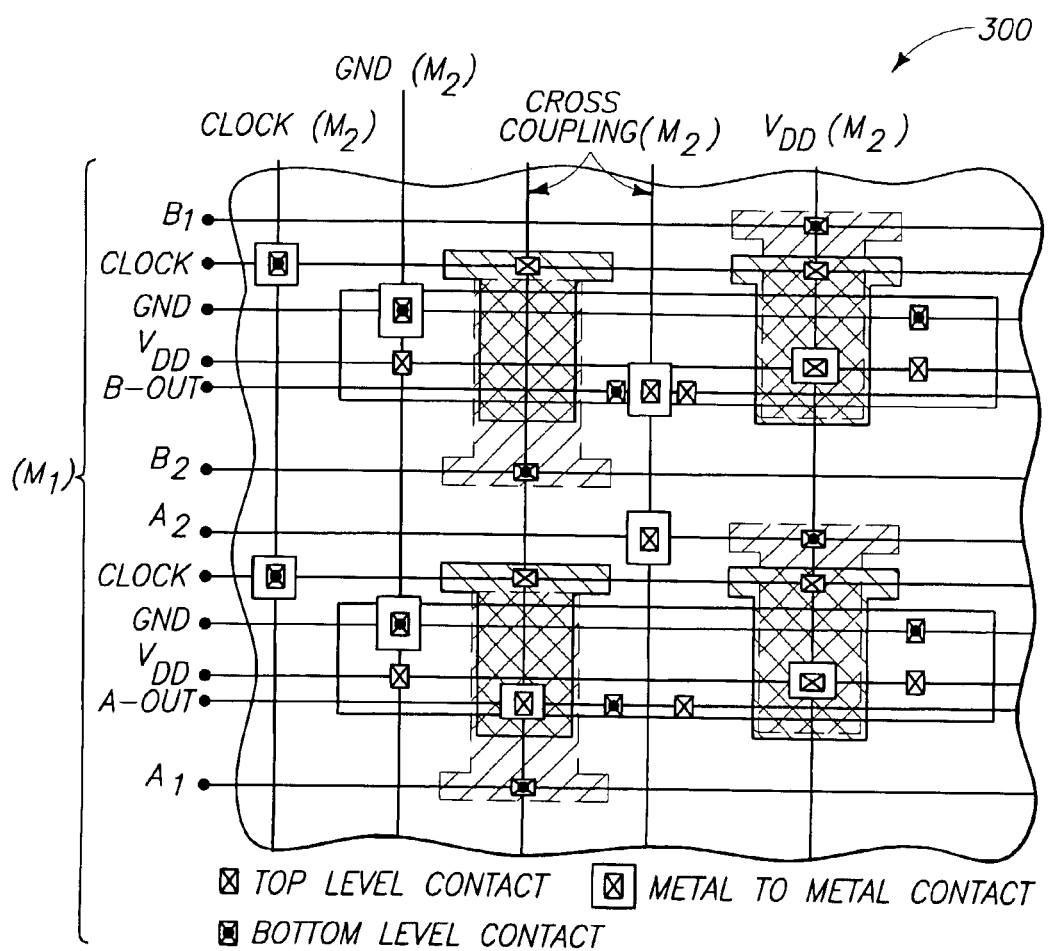
FIG. 17 is a diagrammatic, fragmentary, top view of an exemplary two-NOR cross-coupled latch (flip-flop) logic construction according to an aspect of the present invention.

FIG. 17 illustrates a top view of a construction 300 with a compact two-level metal wireability scheme corresponding to the flip-flop of FIG. 16, and shows that such construction can be formed over a relatively small footprint of a substrate by stacking PFET and NFET devices relative to one another. The flip-flop of FIG. 17 demonstrates twelve metal-one ($M_1$) wiring levels horizontally and five metal-two ($M_2$) levels vertically for interconnecting all appropriate nodes of the latch for full functionality and wireability. It should be noted that $M_1$ wiring channels are grouped into six wiring channels to route $V_{DD}$, ground and clock signals. It should also be noted that the three metal-two ($M_2$) wiring channels bring $V_{DD}$, ground and clock signal levels to $M_1$ via $M_2$-to-$M_1$ contacts, while two other $M_2$ wiring channels are used for $A_2$ and $B_2$ cross-coupling and to bring out the output levels A and B. The scheme, thereby, demonstrates a highly efficient and compact wireability of a higher level logic block, such as a latch.

The design of FIGS. 11 and 12 is a two-input clocked NOR logic cell for device width (W) over length (L) ratio of 10:1. Since PFET gates are in parallel mode, the devices effectively supply twice (W/L equivalent of nearly 20:1) the current. Consequently, such design can approximately balance the mobility ratios of electrons and holes, even though the electrons can have nearly two-times the mobility of the holes. The stacked configuration can therefore allow dense logic cells to be formed. The stacked configuration can also allow wiring channels interconnecting devices to utilize only one level of metal interconnect (as shown in FIG. 12). The dense NAND logic cell layout of FIGS. 14–15 is similar to the NOR cell of FIGS. 11–12, but utilizes stacked top devices which are NFET, while the bottom input devices are PFETs. The stacked approach of FIGS. 11–12 and 14–15 can be utilized to develop various random logic cell libraries, including, for example, the cross-coupled dense flip-flop of FIGS. 16 and 17.

There are numerous advantages to utilizing only a single level of wiring in forming logic devices, including, for example, conservation of semiconductor device real estate, reduction of the number of process steps and masking levels utilized in forming logic devices, and reduction of interconnect delays.

Utilization of Si/Ge layer 26 can improve performance of the devices of FIGS. 10–17 relative to prior art devices having source/drain regions extending into materials consisting of conductively-doped silicon. The performance of the devices can be further enhanced by utilizing a layer 26 having a relaxed crystalline lattice in combination with a layer 40 having a strained crystalline lattice for reasons similar to those discussed above with reference to FIGS. 1–9.

Several of the figures show various different dopant levels, and utilize the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. It is noted that regions identified as being n−, n and n+ will have dopant concentrations similar to those described above relative to the p−, p and p+ regions respectively, except, of course, the n regions will have an opposite-type conductivity enhancing dopant therein than do the p regions.

The p+, p, and p− dopant levels are shown in the drawings only to illustrate differences in dopant concentration. It is noted that the term "p" is utilized herein to refer to both a dopant type and a relative dopant concentration. To aid in interpretation of this specification and the claims that follow, the term "p" is to be understood as referring only to dopant type, and not to a relative dopant concentration, except when it is explicitly stated that the term "p" refers to a relative dopant concentration. Accordingly, for purposes of interpreting this disclosure and the claims that follow, it is to be understood that the term "p-type doped" refers to a dopant type of a region and not a relative dopant level. Thus, a p-type doped region can be doped to any of the p+, p, and p− dopant levels discussed above. Similarly, an n-type doped region can be doped to any of the n+, n, and n− dopant levels discussed above.

Figure 18:
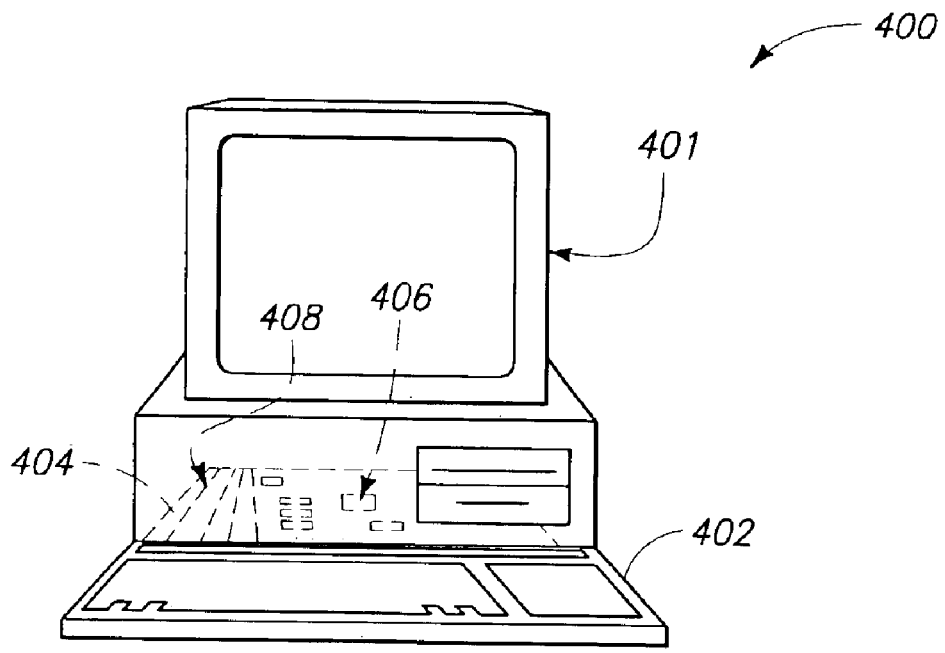
FIG. 18 is a diagrammatic view of a computer illustrating an exemplary application of the present invention.
Figure 19:
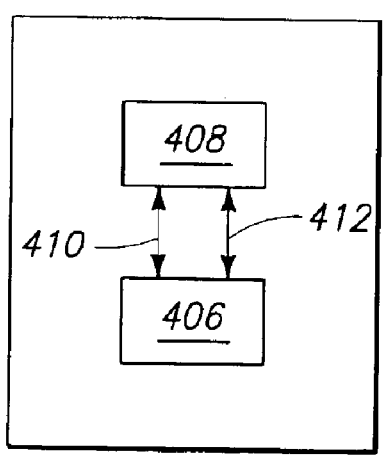
FIG. 19 is a block diagram showing particular features of the motherboard of the FIG. 12 computer.

FIG. 18 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, the DRAM unit cell described with reference to FIG. 8. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 19. In such block diagram, the addressing circuitry is illustrated as 410 and the read circuitry is illustrated as 412. Various components of computer system 400, including processor 406, can comprise one or more of the logic constructions described with reference to FIGS. 10–17.

In particular aspects of the invention, processor device 406 can correspond to a processor module, and associated random logic may be used in the implementation utilizing the teachings of the present invention.

In particular aspects of the invention, memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 20:
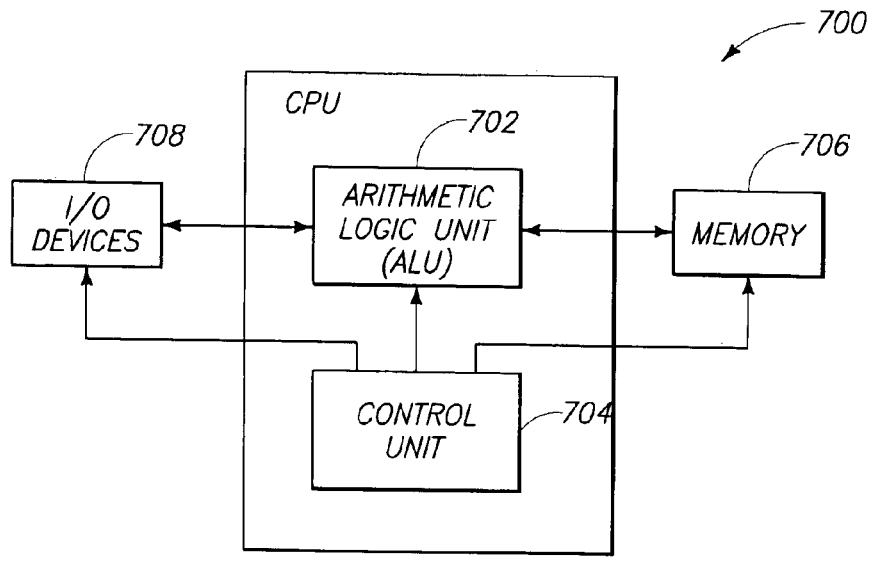
FIG. 20 is a high-level block diagram of an electronic system according to an exemplary aspect of the present invention.

FIG. 20 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells and/or logic constructions in accordance with various aspects of the present invention.

Figure 21:
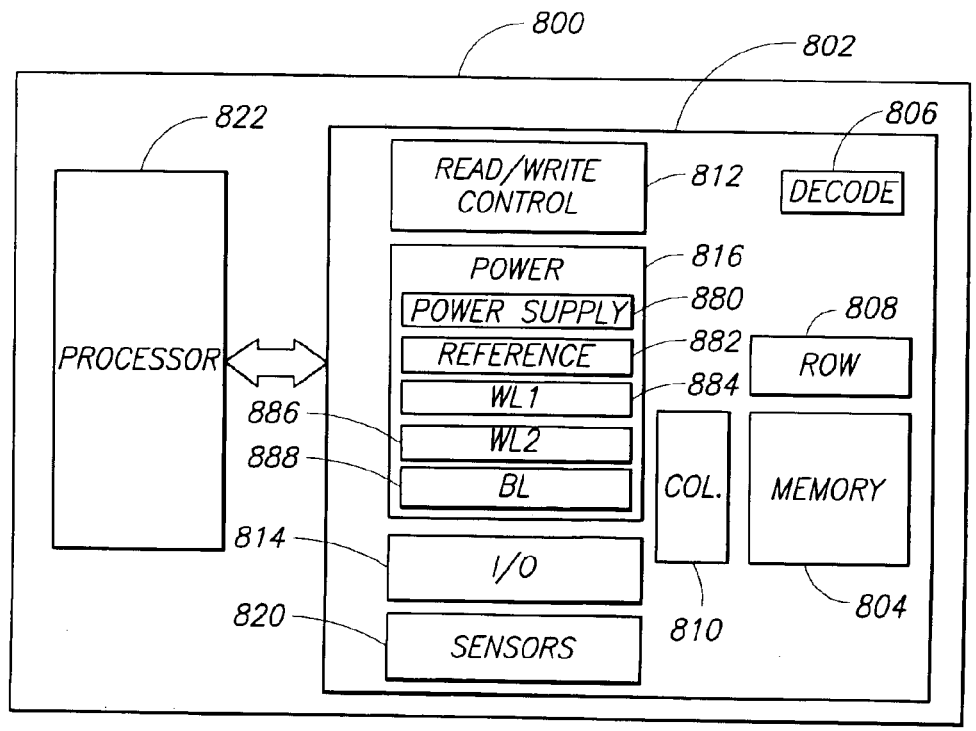
FIG. 21 is a simplified block diagram of an exemplary memory device according to an aspect of the present invention.

FIG. 21 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a DRAM cell and/or random logic construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells and logic constructions can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A logic circuit construction, comprising:
   a first crystalline material which includes silicon and germanium;
   a pair of first transistor devices having first active regions extending into the first crystalline material, the first transistor devices sharing a source/drain region;
   a conductive interconnect in electrical contact with the shared source/drain region and extending upwardly from the shared source/drain region to electrically connect with a second crystalline material which includes silicon and germanium; and
   a pair of second transistor devices having second active regions extending into the second crystalline material.

2. The construction of claim 1 wherein the first crystalline material is part of an SOI construction supported by a substrate.

3. The construction of claim 2 wherein the substrate comprises a semiconductive material.

4. The construction of claim 2 wherein the substrate comprises glass.

5. The construction of claim 2 wherein the substrate comprises aluminum oxide.

6. The construction of claim 2 wherein the substrate comprises silicon dioxide.

7. The construction of claim 2 wherein the substrate comprises a metal.

8. The construction of claim 2 wherein the substrate comprises a plastic.

9. The construction of claim 1 wherein the first active regions are entirely contained within a single crystal of the first crystalline material.

10. The construction of claim 9 wherein the first crystalline material is polycrystalline.

11. The construction of claim 9 wherein the first crystalline material is monocrystalline.

12. The construction of claim 1 wherein the second active regions are entirely contained within a single crystal of the second crystalline material.

13. The construction of claim 12 wherein the second crystalline material is polycrystalline.

14. The construction of claim 12 wherein the second crystalline material is monocrystalline.

15. The construction of claim 1 wherein:
   the first transistor devices have gates over the first crystalline material;
   the first crystalline material has a relaxed crystalline lattice; and
   a strained crystalline lattice layer is between the relaxed crystalline lattice and the gates.

16. The construction of claim 15 wherein the strained crystalline lattice includes silicon.

17. The construction of claim 15 wherein the strained crystalline lattice includes silicon and germanium.

18. The construction of claim 1 wherein:
   the second transistor devices have gates over the second crystalline material;
   the second crystalline material has a relaxed crystalline lattice; and
   a strained crystalline lattice layer is between the relaxed crystalline lattice and the gates.

19. The construction of claim 18 wherein the strained crystalline lattice includes silicon.

20. The construction of claim 18 wherein the strained crystalline lattice includes silicon and germanium.

21. The construction of claim 1 comprising a NOR circuit.

22. The construction of claim 1 comprising a NAND circuit.

23. The construction of claim 1 comprising a pair of NOR circuits in a cross-coupled latch.

24. The construction of claim 1 wherein the first transistor devices are PFET devices and wherein the second transistor devices are NFET devices.

25. The construction of claim 1 wherein the first transistor devices are NFET devices and wherein the second transistor devices are PFET devices.

26. The construction of claim 1 wherein the first crystalline material comprises from about 10 to about 60 atomic percent germanium.

27. The construction of claim 1 wherein the second crystalline material comprises from about 10 to about 60 atomic percent germanium.

28. A logic circuit construction, comprising:
   a first crystalline material which includes silicon and germanium;
   a pair of first transistor devices having first active regions extending into the first crystalline material, the active regions of the first transistor devices overlapping so that the pair of first transistor devices have a common source/drain region; the active regions of the pair of first transistor devices being entirely contained within a single crystal of the first crystalline material;
   a conductive interconnect in electrical contact with the common source/drain region and extending upwardly from the common source/drain region to electrically connect with a second crystalline material which includes silicon and germanium; and
   a pair of second transistor devices having second active regions extending into the second crystalline material.

29. The construction of claim 28 wherein the second active regions overlap so that the second transistor devices have a shared source/drain region; and wherein the second active regions are entirely contained within a single crystal of the second crystalline material.

30. The construction of claim 29 wherein the second crystalline material is polycrystalline.

31. The construction of claim 29 wherein the second crystalline material is monocrystalline.

32. The construction of claim 28 comprising a NOR circuit.

33. The construction of claim 28 comprising a NAND circuit.

34. The construction of claim 28 comprising a pair of NOR circuits in a cross-coupled latch.

35. The construction of claim 28 wherein the first transistor devices are PFET devices and wherein the second transistor devices are NFET devices.

36. The construction of claim 28 wherein the first transistor devices are NFET devices and wherein the second transistor devices are PFET devices.

37. The construction of claim 28 wherein the first crystalline material comprises from about 10 to about 60 atomic percent germanium.

38. The construction of claim 28 wherein the second crystalline material comprises from about 10 to about 60 atomic percent germanium.

39. The construction of claim 28 wherein the first crystalline material is polycrystalline.

40. The construction of claim 28 wherein the first crystalline material is monocrystalline.

41. The construction of claim 28 wherein:
the first transistor devices have gates over the first crystalline material;
the first crystalline material has a relaxed crystalline lattice; and
a strained crystalline lattice layer is between the relaxed crystalline lattice and the gates.

42. The construction of claim 28 wherein:
the second transistor devices have gates over the second crystalline material;
the second crystalline material has a relaxed crystalline lattice; and
a strained crystalline lattice layer is between the relaxed crystalline lattice and the gates.

43. A logic circuit construction, comprising:
a first crystalline material which includes silicon and germanium;
a pair of first transistor devices having first active regions extending into the first crystalline material, the active regions of the first transistor devices overlapping so that the pair of first transistor devices have a common source/drain region;
a conductive interconnect in electrical contact with the common source/drain region and extending upwardly from the common source/drain region to electrically connect with a second crystalline material which includes silicon and germanium; and
a pair of second transistor devices having second active regions extending into the second crystalline material; the active regions of the pair of first transistor devices overlapping and being entirely contained within a single crystal of the second crystalline material.

44. The construction of claim 43 comprising a NOR circuit.

45. The construction of claim 43 comprising a NAND circuit.

46. The construction of claim 43 comprising a pair of NOR circuits in a cross-coupled latch.

47. The construction of claim 43 wherein the first transistor devices are PFET devices and wherein the second transistor devices are NFET devices.

48. The construction of claim 43 wherein the first transistor devices are NFET devices and wherein the second transistor devices are PFET devices.

49. The construction of claim 43 wherein the first crystalline material comprises from about 10 to about 60 atomic percent germanium.

50. The construction of claim 43 wherein the second crystalline material comprises from about 10 to about 60 atomic percent germanium.

51. The construction of claim 43 wherein the second crystalline material is polycrystalline.

52. The construction of claim 43 wherein the second crystalline material is monocrystalline.

53. The construction of claim 43 wherein:
the first transistor devices have gates over the first crystalline material;
the first crystalline material has a relaxed crystalline lattice; and
a strained crystalline lattice layer is between the relaxed crystalline lattice and the gates.

54. The construction of claim 43 wherein:
the second transistor devices have gates over the second crystalline material;
the second crystalline material has a relaxed crystalline lattice; and
a strained crystalline lattice layer is between the relaxed crystalline lattice and the gates.

55. An electronic system comprising:
at least two signal sources arranged to provide at least two data signals; and
a logic construction coupled with the signal sources, configured to receive the data signals and arranged to output a response to the data signals; the logic construction including:
a first crystalline material which includes silicon and germanium;
a pair of first transistor devices having first active regions extending into the first crystalline material, the first transistor devices sharing a first source/drain region;
a conductive interconnect in electrical contact with the shared source/drain region and extending upwardly from the shared source/drain region to electrically connect with a second crystalline material which includes silicon and germanium;
a pair of second transistor devices having second active regions extending into the second crystalline material, the second transistor devices sharing a second source/drain region; and
the input signals being provided to the first transistor devices, and the output exiting from the shared second source/drain region.

56. The system of claim 55 wherein:
the first transistor devices have gates over the first crystalline material;
the first crystalline material has a relaxed crystalline lattice; and
a strained crystalline lattice layer is between the relaxed crystalline lattice and the gates.

57. The system of claim 56 wherein the strained crystalline lattice includes silicon.

58. The system of claim 56 wherein the strained crystalline lattice includes silicon and germanium.

59. The system of claim 55 wherein:
the second transistor devices have gates over the second crystalline material;
the second crystalline material has a relaxed crystalline lattice; and
a strained crystalline lattice layer is between the relaxed crystalline lattice and the gates.

60. The system of claim 59 wherein the strained crystalline lattice includes silicon.

61. The system of claim 59 wherein the strained crystalline lattice includes silicon and germanium.

62. The system of claim 55 wherein the logic construction comprises a NOR circuit.

63. The system of claim 55 wherein the logic construction comprises a NAND circuit.

64. The system of claim 55 wherein the logic construction comprises a pair of NOR circuits in a cross-coupled latch.

65. The system of claim 55 wherein the first transistor devices are PFET devices and wherein the second transistor devices are NFET devices.

66. The system of claim 55 wherein the first transistor devices are NFET devices and wherein the second transistor devices are PFET devices.

67. The system of claim 55 wherein the first crystalline material comprises from about 10 to about 60 atomic percent germanium.

68. The system of claim 55 wherein the second crystalline material comprises from about 10 to about 60 atomic percent germanium.

69. The system of claim 55 wherein the first active regions are entirely contained within a single crystal of the first crystalline material.

70. The system of claim 55 wherein the second active regions are entirely contained within a single crystal of the second crystalline material.

* * * * *

UNITED STATES PATENT AND TRADEMARK OFFICE
CERTIFICATE OF CORRECTION

PATENT NO. : 6,900,667 B2  
APPLICATION NO. : 10/387090  
DATED : May 31, 2005  
INVENTOR(S) : Bhattacharyya Page 1 of 1

It is certified that error appears in the above-identified patent and that said Letters Patent is hereby corrected as shown below:

Col. 3, line, 13 –  
    Replace "Digest, 2002, 00. 98-99; and Huang, L.J. et al., "Carrier"  
    Insert -- Digest, 2002, pp. 98-99; and Huang, L.J. et al., "Carrier--

Col. 14, line, 47 –  
    Replace "connection the $V_{REF}$/GND. The NAND construction"  
    Insert -- connection with the $V_{REF}$/GND. The NAND construction--

Col. 15, line, 66 –  
    Replace "nodes of PFET devices 202 and 204 as well of the"  
    Insert -- nodes of PFET devices 202 and 204 as well as the--

Col. 19, line, 7 –  
    Replace "present invention. One of the ordinary skill in the art will"  
    Insert -- present invention. One of ordinary skill in the art will --

Signed and Sealed this

Sixth Day of February, 2007

JON W. DUDAS  
*Director of the United States Patent and Trademark Office*